United States Patent
Quick et al.

(10) Patent No.: US 8,828,769 B2
(45) Date of Patent: Sep. 9, 2014

(54) ENERGY CONVERSION DEVICE

(75) Inventors: Nathaniel R. Quick, Lake Mary, FL (US); Aravinda Kar, Oviedo, FL (US)

(73) Assignee: University of Central Florida, Orlando, FL (US)

( * ) Notice: Subject to any disclaimer, the term of this patent is extended or adjusted under 35 U.S.C. 154(b) by 839 days.

(21) Appl. No.: 12/592,695

(22) Filed: Dec. 1, 2009

(65) Prior Publication Data
US 2011/0056542 A1    Mar. 10, 2011

Related U.S. Application Data

(60) Provisional application No. 61/200,632, filed on Dec. 2, 2008.

(51) Int. Cl.
*H01L 21/00*    (2006.01)

(52) U.S. Cl.
USPC ............................................. 438/48; 438/480

(58) Field of Classification Search
USPC ............... 438/48, 57, 63, 85, 96, 97, 98, 761, 438/762, 930, 931, FOR. 260, 478–480, 438/501, 505; 257/E21.054, E21.065, 257/E21.28, E21.281
See application file for complete search history.

(56) References Cited

U.S. PATENT DOCUMENTS

| | | | |
|---|---|---|---|
| 3,214,315 A | 10/1965 | Hildebrand | |
| 3,396,401 A | 8/1968 | Nonomura | |
| 3,419,321 A | 12/1968 | Barber et al. | |
| 3,605,469 A | 9/1971 | Queralto | |
| 3,788,120 A | 1/1974 | Takeo et al. | |
| 3,854,123 A | 12/1974 | Banach | |
| 3,865,564 A | 2/1975 | Jaeger et al. | |
| 3,874,240 A | 4/1975 | Rembaum | |
| 3,943,324 A | 3/1976 | Haggerty | |
| 3,944,640 A | 3/1976 | Haggerty et al. | |
| 3,945,318 A | 3/1976 | Landsman | |

(Continued)

FOREIGN PATENT DOCUMENTS

| | | |
|---|---|---|
| GB | WO 03013757 | 2/2000 |
| JP | 358095830 A | 6/1983 |
| JP | 405024975 A | 2/1993 |

OTHER PUBLICATIONS

Nathaniel R. Quick, Laser Conversion of Ceramic Materials to Electroconductors, International Conference on Electronic Materials—1990, Materials Research Society, Newark, New Jersey, Sep. 17-19, 1990.

(Continued)

*Primary Examiner* — Jae Lee
*Assistant Examiner* — Quovaunda V Jefferson
(74) *Attorney, Agent, or Firm* — Frijouf, Rust & Pyle P.A.

(57) ABSTRACT

A solid-state energy conversion device and method of making is disclosed wherein the solid-state energy conversion device is formed through the conversion of an insulating material. In one embodiment, the solid-state energy conversion device operates as a photovoltaic device to provide an output of electrical energy upon an input of electromagnetic radiation. In another embodiment, the solid-state energy conversion device operates as a light emitting device to provide an output of electromagnetic radiation upon an input of electrical energy. In one example, the photovoltaic device is combined with a solar liquid heater for heating a liquid. In another example, the photovoltaic device is combined with a solar liquid heater for treating water.

6 Claims, 11 Drawing Sheets

(56) References Cited

U.S. PATENT DOCUMENTS

| | | | |
|---|---|---|---|
| 3,965,328 A | 6/1976 | Locke | |
| 3,981,705 A | 9/1976 | Jaeger et al. | |
| 4,043,170 A | 8/1977 | Erodi et al. | |
| 4,135,902 A | 1/1979 | Oehrle | |
| 4,142,088 A | 2/1979 | Hirsch | |
| 4,159,414 A | 6/1979 | Suh et al. | |
| 4,215,263 A | 7/1980 | Grey et al. | |
| 4,309,224 A | 1/1982 | Shibata | |
| 4,339,285 A | 7/1982 | Pankove | |
| 4,372,989 A | 2/1983 | Menzel | |
| 4,383,843 A | 5/1983 | Iyengar | |
| 4,496,607 A | 1/1985 | Mathias | |
| 4,539,251 A | 9/1985 | Sugisawa et al. | |
| 4,547,650 A | 10/1985 | Arditty et al. | |
| 4,559,552 A * | 12/1985 | Yamazaki | 257/53 |
| 4,565,712 A | 1/1986 | Noguchi et al. | |
| 4,620,264 A | 10/1986 | Ushifusa et al. | |
| 4,624,934 A | 11/1986 | Kokubu et al. | |
| 4,663,826 A | 5/1987 | Bauerle | |
| 4,691,091 A | 9/1987 | Lyons et al. | |
| 4,710,253 A | 12/1987 | Soszek | |
| 4,761,339 A | 8/1988 | Komatsu et al. | |
| 4,791,239 A | 12/1988 | Shirahata et al. | |
| 4,840,853 A | 6/1989 | Lio et al. | |
| 4,847,138 A | 7/1989 | Boylan et al. | |
| 4,860,442 A | 8/1989 | Ainsworth et al. | |
| 4,872,923 A | 10/1989 | Borodin | |
| 4,880,770 A | 11/1989 | Mir et al. | |
| 4,901,550 A | 2/1990 | Koide | |
| 4,912,087 A | 3/1990 | Aslam et al. | |
| 4,924,033 A | 5/1990 | Iyogi et al. | |
| 4,950,558 A | 8/1990 | Sarin | |
| 4,962,085 A | 10/1990 | deBarbadillo, II et al. | |
| 4,988,564 A | 1/1991 | D'Angelo et al. | |
| 5,015,618 A | 5/1991 | Levinson | |
| 5,027,168 A * | 6/1991 | Edmond | 257/103 |
| 5,055,967 A | 10/1991 | Sukonnik et al. | |
| 5,127,364 A | 7/1992 | Savkar et al. | |
| 5,145,741 A | 9/1992 | Quick | |
| 5,149,681 A | 9/1992 | Ohkawa et al. | |
| 5,180,440 A | 1/1993 | Siegel et al. | |
| 5,336,360 A | 8/1994 | Nordine | |
| 5,391,841 A | 2/1995 | Quick | |
| 5,405,481 A | 4/1995 | Licoppe et al. | |
| 5,459,098 A | 10/1995 | Maya | |
| 5,493,096 A | 2/1996 | Koh | |
| 5,549,971 A | 8/1996 | Nordine | |
| 5,629,532 A | 5/1997 | Myrick | |
| 5,680,200 A | 10/1997 | Sugaya et al. | |
| 5,695,828 A | 12/1997 | Ghosh et al. | |
| 5,733,609 A | 3/1998 | Wang | |
| 5,754,299 A | 5/1998 | Sugaya et al. | |
| 5,793,042 A | 8/1998 | Quick | |
| 5,823,039 A | 10/1998 | Umeda et al. | |
| 5,837,607 A | 11/1998 | Quick | |
| 5,847,418 A | 12/1998 | Nakamura et al. | |
| 5,889,234 A | 3/1999 | Ghosh et al. | |
| 5,906,708 A | 5/1999 | Robinson et al. | |
| 5,961,877 A | 10/1999 | Robinson et al. | |
| 6,025,609 A | 2/2000 | Quick | |
| 6,054,375 A | 4/2000 | Quick | |
| 6,064,081 A | 5/2000 | Robinson et al. | |
| 6,203,861 B1 | 3/2001 | Kar et al. | |
| 6,221,154 B1 | 4/2001 | Lee et al. | |
| 6,252,197 B1 | 6/2001 | Hoekstra et al. | |
| 6,255,671 B1 | 7/2001 | Bojarczuk et al. | |
| 6,271,576 B1 | 8/2001 | Quick | |
| 6,274,234 B1 | 8/2001 | Dujardin et al. | |
| 6,297,100 B1 * | 10/2001 | Kumar et al. | 438/268 |
| 6,313,015 B1 | 11/2001 | Lee et al. | |
| 6,334,939 B1 | 1/2002 | Zhou et al. | |
| 6,407,443 B2 | 6/2002 | Chen et al. | |
| 6,526,327 B2 | 2/2003 | Kar et al. | |
| 6,621,448 B1 | 9/2003 | Lasky et al. | |
| 6,670,693 B1 | 12/2003 | Quick | |
| 6,732,562 B2 | 5/2004 | Quick et al. | |
| 6,781,156 B2 * | 8/2004 | Drobnis et al. | 257/77 |
| 6,930,009 B1 | 8/2005 | Quick | |
| 6,939,748 B1 | 9/2005 | Quick | |
| 7,237,422 B2 | 7/2007 | Quick et al. | |
| 7,268,063 B1 | 9/2007 | Quick | |
| 7,419,887 B1 | 9/2008 | Quick | |
| 7,618,880 B1 * | 11/2009 | Quick | 438/478 |

OTHER PUBLICATIONS

Nathaniel R. Quick, Direct Conversion of Conductors on Ceramic Substrates, International Society for Hybrid Microelectronics, ISHM 90 Proceedings 1990.

Nathaniel R. Quick and Jeffrey A. Phillips, Laser Processes for Integrating Substrate Fabrication, Proceedings of the International Conference on Lasers '91, The Society for Optical & Quantum Electronics, pp. 537-544 San Diego, CA Dec. 9-13, 1991.

Nathaniel R. Quick and Richard J. Matson, Characterization of a Ceramic Electrical Conductor Synthesized by a Laser Conversion Process, Proceedings of the International Conference on Lasers '91, The Society for Optical & Quantum Electronics, pp. 545-552 San Diego, CA Dec. 9-13, 1991.

Nathaniel R. Quick, Characterization of a Ceramic Sensor Synthesized by a Laser Conversion Process, Proceedings of the International Conference on Lasers '92, The Society for Optical & Quantum Electonics, pp. 881-887 Houston, Texas Dec. 7-10, 1992.

Nathaniel R. Quick, Characterization of a Ceramic Thermal Sensor Synthesized by a Laser Conversion Process, ICALEO '92 (International Congress on Applications of Lasers and Electro-Optics), vol. 75 Laser Materials Processing, Laser Institute of America, pp. 394-404 Oct. 25-29, 1992.

D. K. Sengupta, N. R. Quick and A. Kar, Laser Direct Write of Conducting and Insulating Tracks in Silicon Carbide, Materials Research Society Symposium Proceedings vol. 624 pp. 127-133 2000

D. K. Sengupta, N. R. Quick and A. Kar, Laser Conversion of Electrical Properties for Silicon Carbide Device Applications, Journal of Laser Applications., 2001, vol. 13, pp. 26-31

I.A. Salama, N.R. Quick and A. Kar, Laser Doping of Silicon Carbide Substrates, Journal of Electronic Materials, vol. 31, 2002, pp. 200-208

I.A. Salama, N. R. Quick and A. Kar, Microstructural and electrical resistance analysis of laser-processed SiC substrates for wide bandgap semiconductor materials, Journal of Materials Science, vol. 40, 2005, pp. 3969-3980

I.A. Salama, N. R. Quick and A. Kar, Laser Synthesis of Carbon-Rich SiC Nanoribbons, Journal of Applied Physics, vol. 93, 2003, pp. 9275-9281.

I.A. Salama, N.R. Quick, and A. Kar, Laser Direct Write Doping of Wide-Bandgap Semiconductor Materials,IEEE ISCS 2003 Proceedings.

A. Salama, C. F. Middleton, N. R. Quick G. D. Boreman and A. Kar, Laser-Metallized Silicon Carbide Schottky Diodes for Millimeter Wave Detection and Frequency Mixing, Symposium N1 Nitride and Wide Bandgap Semiconductors for Sensors, Photonics and Electronics IV, 204th Meeting of the Electrochemical Society, Orlando, Florida Oct. 12-16, 2003.

A. Salama, N. R. Quick and A. Kar, Laser Direct Metallization of Silicon Carbide without Metal Deposition, Symposium C, New Applications for Wide Bandgap Semiconductors, Materials Research Society, Apr. 23-24, 2003.

I. A. Salama, N. R. Quick and A. Kar, Laser-induced Dopant Incorporation in Wide Bandgap Materials: SiC and GaN, ICALEO 2003 (International Congress on Applications of Lasers and Electro-Optics) Proceedings, 2003.

I.A. Salama, N.R. Quick, and A. Kar, Laser Direct Writing and Doping of Diamond-like Carbon, Polycrystalline Diamond and Single Crystal Silicon Carbide; Journal of Laser Applications, vol. 16, 2004, pp. 92-99.

Z. Tian, N. R. Quick and A. Kar, Laser Direct Write and Gas Immersion Laser Doping Fabrication of SiC Diodes, J: Silicon Carbide Materials, Procesing and Devices, Symposium J Apr. 14-15, 2004.

(56) References Cited

OTHER PUBLICATIONS

Z. Tian, N. R, Quick and A. Kar, Laser Doping of Silicon Carbon and PIN Diode Fabrication, 23rd International Congress on Applications of Lasers & Electro-Optics 2004.

A. Kar and N. R. Quick, Laser Processing for Wide Bandgap Semiconductor Device Fabrication, 2004 Meeting of Optical Society of America, 2004.

Z. Tian, I.A. Salama, N. R. Quick and A. Kar, Effects of Different laser Sources and Doping Methods used to Dope Silicon Carbide, Acta Materialia, vol. 53, 2005, pp. 2835-2844.

I.A. Salama, N. R. Quick and A. Kar, Microstructural and electrical resistance analysis of laser-processed SiC substrates for wide bandgap semiconductor materials, Journal of Materials Science, vol. 40, 2005, pp. 3969-3980.

Z. Tian, N. R. Quick and A. Kar; Characteristics of 6H-Silicon Carbide PIN Diodes Prototyping by Laser Doping, Journal of Electronic Materials, vol. 34, 2005, pp. 430-438.

Chong Zhang, A. Salama, N. R. Quick and A. Kar, Two-Dimensional Transient Modeling of $CO_2$ Laser Drilling of Microvias in High Density Flip Chip Substrates, ICALEO 2005 (International Congress on Applications of Lasers and Electro-Optics), Laser Institute of America, Oct. 31-Nov. 3, 2005.

Chong Zhang, S. Bet, A. Salama, N. R. Quick and A. Kar, $CO_2$ Laser Drilling of Microvias Using Diffractive Optics Techniques, I Mathematical Modeling, InterPack 05, The ASME/Pacific Rim Technical Conference on Integration and Packaging of MEMS. NEMS and Electronic Systems, San Francisco, CA Jul. 17-22, 2005.

Z. Tian, N. R. Quick and A. Kar, Laser Synthesis of Optical Structures in Silicon Carbide, 207th Meeting of the Electrochemical Society Proceedings, May 15-20, 2005.

Z. Tian, N.R. Quick and A. Kar, Laser-enhanced diffusion of nitrogen and aluminum dopants in silicon carbide, Acta Materiallia, vol. 54, 2006, pp. 4273-4283.

Z. Tian, N.R. Quick and A. Kar,Laser Direct Write Doping and Metallization Fabrication of Silicon Carbide PIN Diodes, Materials Science Forum, vols. 527-529, 2006, pp. 823-826.

S. Dakshinamurthy, N.R. Quick and A. Kar, SiC-based Optical Interferometry at high pressures and temperatures for pressure and chemical sensing, Journal of Applied Physics, vol. 99, 2006, pp. 094902-1 to 094902-8.

C. Zhang, A. Salama, N. R. Quick and A. Kar, Modelling of Microvia Drilling with a Nd:YAG Laser, Journal of Physics D: Applied Physics 39 (2006) 3910-3918.

Z. Tian, N. R. Quick and A. Kar, Laser Endotaxy and PIN Diode Fabrication of Silicon Carbide, 2006 Spring Meting of Materials Research Society, 2006.

Z. Tian, N. R. Quick and A. Kar, Characteristics of Laser-Fabricated Diodes on Endotaxial Silicon Carbide Substrates, ESCRM (European Conference on Silicon Carbide and Related Materials) Proceedings 2006.

S. Bet, N.R. Quick and A. Kar, Laser Doping of Chromium and Selenium in p-type 4H-SiC, ICSCRM 2007 Symposium.

N. Quick, S. Bet and A. Kar, Laser Doping Fabrication of Energy Conversion Devices Materials Science and Technology 2007 Conference and Exhibition.

S. Bet, N.R. Quick and A. Kar, Effect of Laser Field and Thermal Stress on Diffusion in Laser Doping of SiC, Acta Materialia 55 (2007) 6816-6824.

S. Bet, N.R. Quick and A. Kar, Laser-Doping of Silicon Carbide for p-n Junction and LED Fabrication, Physica Status Solidi (A), vol. 204, No. 4, 2007, pp. 1147-1157.

S. Dakshinamurthy, N.R. Quick and A. Kar, Temperature-dependent Optical Propertes of Silicon Carbide for Wireless Temperature Sensors, Journal of PhysicsD: Applied Physics 40 (2007)353-360.

S. Dakshinamurthy, N.R. Quick and A. Kar, High temperature optical properties of silicon carbide for wireless thermal sensing, Journal of Physics D: Applied Physics, vol. 40, No. 2, 2007, pp. 353-360.

Chong Zhang, A. Salama, N. R. Quick and A. Kar, Determination of Thermophysical Properties for Polymer Films using Conduction Analysis of Laser Heating, International Journal of Thermophysics, vol. 28, No. 3, Jun. 2007.

N. R. Quick, S. Bet and A. Kar, Laser Doping Fabrication of Energy Conversion Devices, Materials Science and Technology 2007 Conference and Exhibition, Sep. 19, 2007.

S. Bet, N.R. Quick and A. Kar, Laser Doping of Chromium in 6H-SiC for White Light Emitting Diodes, Laser Institute of America, Journal of Laser Applications Vo. 20 No. 1 pp. 43-49 Feb. 2008.

Z. Tian, N. R. Quick and A. Kar, Laser Endotaxy in Silicon Carbide and PIN Diode Fabrication, Laser Institute of America, Journal of Laser Applications, vol. 20 No. 2 pp. 106-115, May 2008.

I. Salama, N. Quick and A. Kar, Laser Direct Write Doping of Wide-Bandgap Semiconductor Materials, ISCS 2003 Proceedings ,2003.

I. Salama, N. Quick and A. Kar, Laser Microprocessing of Wide Bandgap Materials, Proceedings of International Congress on Laser Advanced Materials Processing (LAMP 2002).

S. Bet, N. Quick and A. Kar, Laser Doping of Chromium and Selenium in P-Type 4H-SiC, Materials Science Forum vols. 600-603 (2009) pp. 627-630.

* cited by examiner

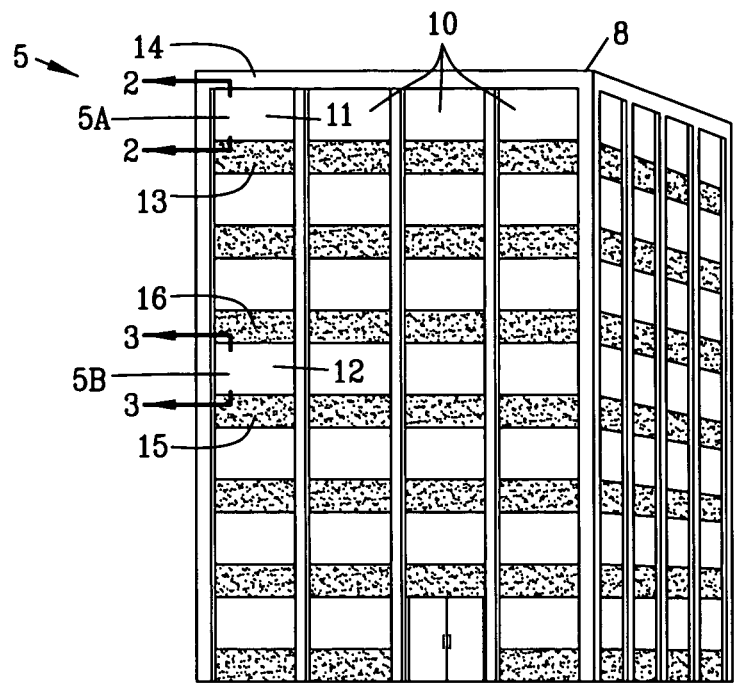
FIG. 1
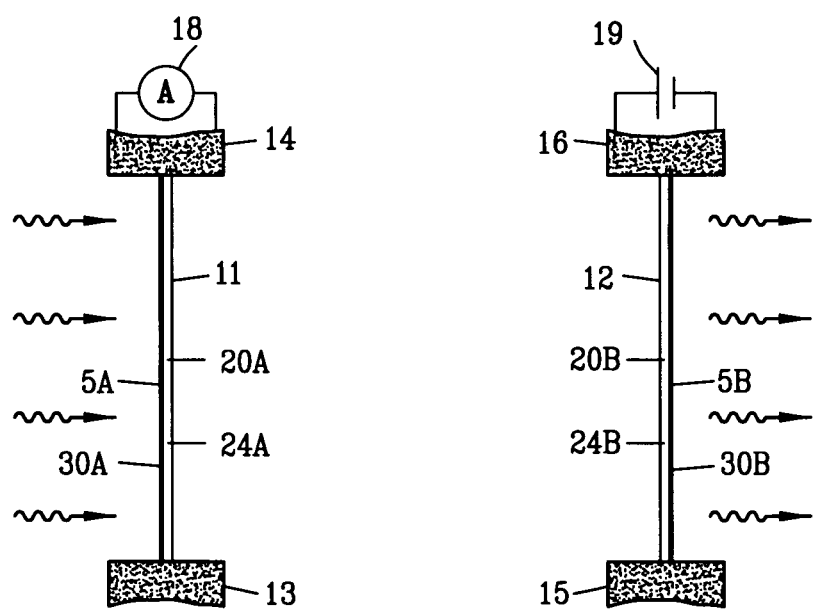
FIG. 2
FIG. 3

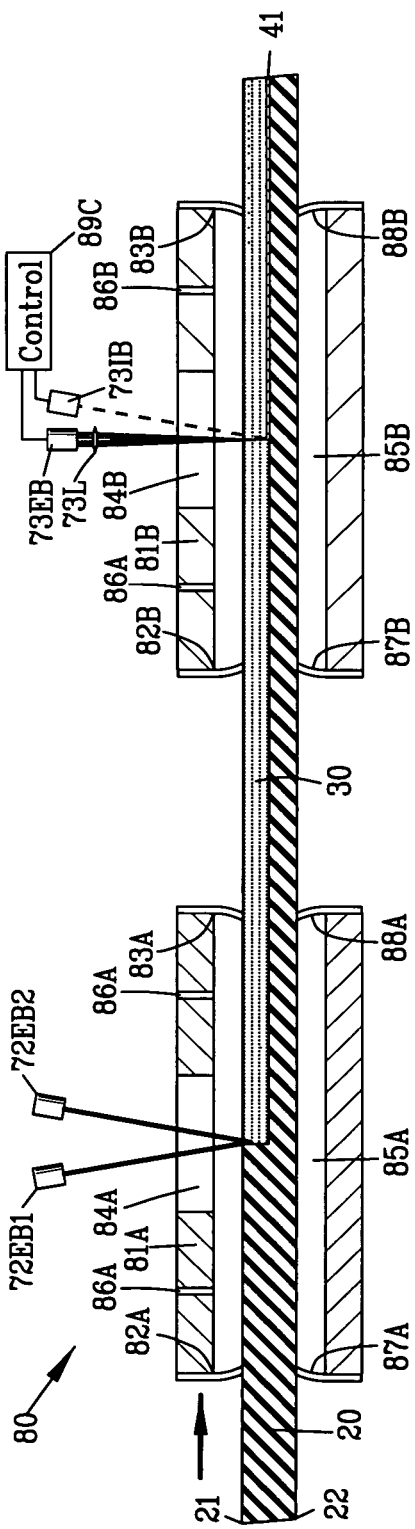
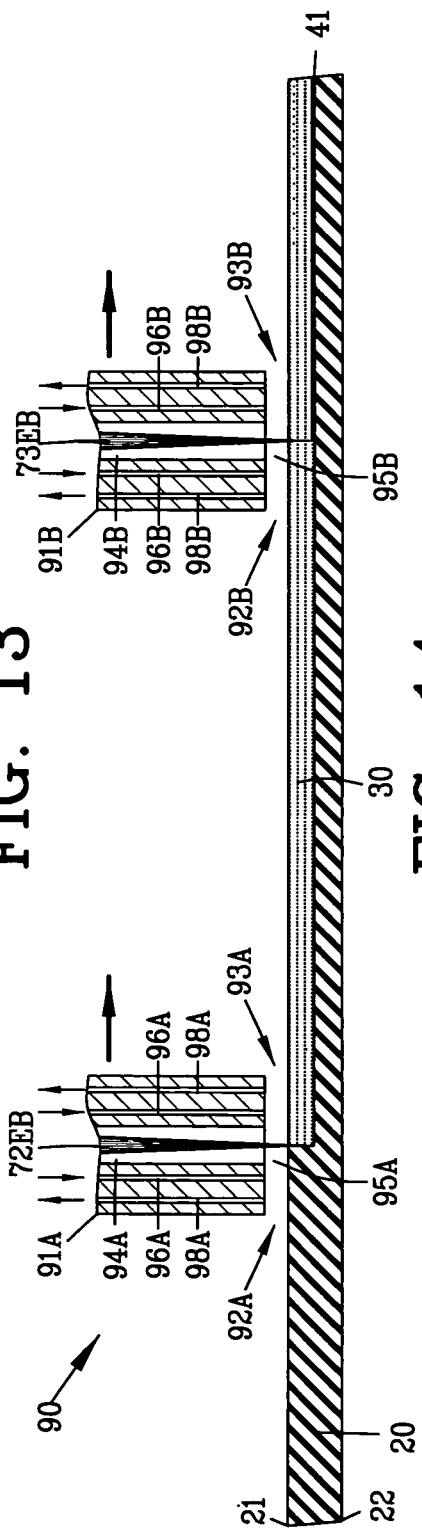
FIG. 13
FIG. 14 ure to silicon sublimation and redistribution [Z. Tian, N. R. Quick and A. Kar, Acta Materialia, 54, 4273, (2006)]. In summary conventional doping processes limit the dopant species, dopant concentrations and create defects.

ENERGY CONVERSION DEVICE

CROSS-REFERENCE TO RELATED APPLICATIONS

This application claims benefit of U.S. Patent Provisional application No. 61/200,632 filed Dec. 2, 2008. All subject matter set forth in provisional application No. 61/200,632 is hereby incorporated by reference into the present application as if fully set forth herein.

BACKGROUND OF THE INVENTION

1. Field of the Invention

This invention relates to energy conversion and more particularly to an energy conversion device for converting energy between electromagnetic and electrical energy such as light emitting device, photovoltaic device, solar liquid heating device and water purification device.

2. Background of the Invention

Recent concerns regarding the cost and shortage of fossil fuels have challenge the art in developing various types of renewable energy as well as various forms of energy conservation. One of the most promising areas of renewable energy is through the conversion of electromagnetic radiation emitted by the sun into electric power and/or usable heat. It should be realized that nearly all energy other than nuclear energy and geothermal energy is ultimately derived from the sun.

The prior art has been known various types of devices for converting electromagnetic radiation emitted by the sun into electric power. These types of devices are commonly referred to as photovoltaic devices for converting electromagnetic radiation emitted by the sun electrical energy directly into electric power. These devices produced no harmful gases during the energy conversion process.

Although photovoltaic energy conversion devices have found use in limited applications, the cost and efficiency of photovoltaic energy conversion devices have limited the widespread use of the photovoltaic energy conversion device.

One promising area of energy conservation may be found in the use of solid-state light emitting energy conversion devices that produce electromagnetic radiation or light upon an input of electric power. These solid-state light emitting energy conversion devices produce electromagnetic radiation with little energy wasted on heat. Although solid-state light emitting energy conversion devices have found use in limited applications, the cost and efficiency of solid state light emitting energy conversion devices have limited the widespread use thereof.

Both solid-state photovoltaic energy conversion devices and solid-state light emitting energy conversion devices operate on similar solid-state principles. In principle, solid-state energy conversion devices are reversible and maybe operated as a photovoltaic energy conversion device or a light emitting energy conversion device. Typically, a solid-state energy conversion device is specifically constructed to operate either as a photovoltaic energy conversion device or a light emitting energy conversion device.

A variety of semiconductors including GaN (Gallium Nitride), GaP (Gallium Phosphide), AlGaAs (Aluminum Gallium Arsenide), InP (Indium Phosphide), Si (Silicon) and SiC are currently being studied for light emitting diode (LED) applications. Recently, efficient luminescence has been discovered in silicon, which is an indirect bandgap semiconductor, due to alteration of its defect states [Wai Lek Ng, et al, Nature, Vol. 410, Issue 8 (2001)]. However in SiC, an indirect bandgap wide-bandgap semiconductor (WBGS) generally emitting in the blue spectra, no efficient radiative isoelectronic trap has been discovered; consequently development of this LED material has languished. Other recent papers show that SiC LEDs have potential for high quantum efficiency [a) S. I. Vlaskina, "Silicon Carbide LED", Semiconductor Physics, Quantum Electronics & Optoelectronics, 2002, Vol. 5, No. 1, pp 71-75, b) S. Kamiyama et al, "Extremely high quantum efficiency of donor-acceptor-pair emission in N- and B-doped 6H—SiC, JAP, 99, 093108 (2006).

P-type doping, particularly exhibiting low resistivity, has been a drawback for wide-bandgap semiconductor LED material candidates. Ion implantation and thermal diffusion are currently the most widely used techniques for doping semiconductors. The energy scattered by the decelerating ions leads to crystal damage by introducing point defects and the formation of amorphous material. Post ion implantation high temperature annealing isothermally heats the wafer inducing undesirable dopant diffusion in previously prepared under layers.

Doping is one of the challenges for wide bandgap semiconductors, particularly SiC-device fabrication, due to its hardness, chemical inertness and the low diffusion coefficient of most impurities [I. A. Salama, Ph.D. Dissertation, University of Central Florida, Spring (2003)]. Current doping methods used for SiC device fabrication include epilayer doping and ion implantation. Maximum doping concentration is limited by the solubility and dopant depth is limited by the mass diffusion coefficient of the dopant in the wide bandgap semiconductor substrate. Epilayer doping is in situ doping during chemical vapor deposition epitaxial growth and is limited in SiC to nitrogen (N) or phosphorous (P) for n-type, aluminum (Al) or boron (B) for p-type and vanadium (V) for semi-insulating type. Ion implantation is the most common doping technique used for wide bandgap semiconductor devices. This process generates implantation-induced defect centers including amorphitization in the wafer and requires high annealing temperatures to remove these defects and to electrically activate the dopants. In SiC some defects remain after annealing at temperatures up to 1700° C. [Z. Tian., N. R. Quick. and A. Kar, Acta Materialia, Vol. 53, (2005), pp. 2835-2844]. Annealing at these temperatures can cause severe surface damage due to silicon sublimation and redistribution [Z. Tian, N. R. Quick and A. Kar, Acta Materialia, 54, 4273, (2006)]. In summary conventional doping processes limit the dopant species, dopant concentrations and create defects.

Photolithographic patterning is necessary to define the areas across the sample to be selectively doped. This usually requires up to 10-15 individual processing steps. Damage assisted sublimation etching (DASE) of Si and dopant outdiffusion are common problems observed during ion implantation of SiC. Techniques allowing direct doping without the requirement for prepatterning can become economically viable [a) S. J. Pearton, Processing of Wide Bandgap Semiconductors, 1st Edition, William Andrew Publishing, 2000; b) Z. C. Feng, J. H. Zhao, "Silicon Carbide: Materials, Processing, Devices", Optoelectronic Properties of Semiconductors and Superlattices, vol. 20, Taylor and Francis Books, Inc., 2004; c) M. E. Levinshtein et al, "Properties of Advanced Semiconductor Materials", Wiely-Interscience Publications, 2001].

U.S. Pat. No. 5,063,421 to Suzuki et al. discloses a silicon carbide light emitting diode having a p-n junction which comprises a semiconductor substrate, a first silicon carbide single-crystal layer of one conductivity formed on the substrate, and a second silicon carbide single-crystal layer of the opposite conductivity formed on the first silicon carbide layer, the first and second silicon carbide layers constituting the p-n junction, wherein at least one of the first and second silicon carbide layers contains a tetravalent transition element as a luminescent center.

U.S. Pat. No. 5,243,204 to Suzuki et al. discloses silicon carbide light emitting diodes having a p-n junction that is constituted by a p-type silicon carbide single-crystal layer and an n-type silicon carbide single-crystal layer formed thereon. In cases where light emission caused by recombination of free excitons is substantially utilized, at least a part of the n-type silicon carbide layer adjacent to the interface of the p-n junction is doped with a donor impurity at a concentration of $5 \times 10^{16}$ cm$^{-3}$ or lower. In cases where light emission caused by acceptor-associated recombination is substantially utilized, the p-type silicon carbide layer is doped with an acceptor impurity and at least a part of the n-type silicon carbide layer adjacent to the interface of the p-n junction is doped with a donor impurity at a concentration of $1 \times 10^{18}$ cm$^{-3}$ or higher. Also provided are a method for producing such silicon carbide light emitting diodes and a method for producing another silicon carbide light emitting diode.

U.S. Pat. No. 5,416,342 to Edmond et al. discloses a light emitting diode that emits light in the blue portion of the visible spectrum with high external quantum efficiency. The diode comprises a single crystal silicon carbide substrate having a first conductivity type, a first epitaxial layer of silicon carbide on the substrate and having the same conductivity type as the substrate, and a second epitaxial layer of silicon carbide on the first epitaxial layer and having the opposite conductivity type from the first layer. The first and second epitaxial layers forming a p-n junction, and the diode includes Ohmic contacts for applying a potential difference across the p-n junction. The second epitaxial layer has side walls and a top surface that forms the top surface of the diode, and the second epitaxial layer has a thickness sufficient to increase the solid angle at which light emitted by the junction will radiate externally from the side walls, but less than the thickness at which internal absorption in said second layer would substantially reduce the light emitted from said top surface of the diode.

U.S. Pat. No. 6,900,465 to Nakamura et al. discloses a nitride semiconductor light-emitting device having an active layer of a single-quantum well structure or multi-quantum well made of a nitride semiconductor containing indium and gallium. A first p-type clad layer made of a p-type nitride semiconductor containing aluminum and gallium is provided in contact with one surface of the active layer. A second p-type clad layer made of a p-type nitride semiconductor containing aluminum and gallium is provided on the first p-type clad layer. The second p-type clad layer has a larger band gap than that of the first p-type clad layer. An n-type semiconductor layer is provided in contact with the other surface of the active layer.

U.S. Pat. No. 6,998,690 to Nakamura et al discloses a gallium nitride-based III-V Group compound semiconductor device that has a gallium nitride-based III-V Group compound semiconductor layer provided over a substrate, and an Ohmic electrode provided in contact with the semiconductor layer. The Ohmic electrode is formed from a metallic material, and has been annealed.

U.S. Pat. No. 7,045,375 to Wu et al. discloses a white-light emitting device comprising a first photon recycling semiconductor-light emitting diode (PRS-LED) and a second PRS-LED. The first PRS-LED has a primary light source to emit blue light and a secondary light source to emit red light responsive to the blue light; and the second PRS-LED has a primary light source to emit green light and a secondary light source for emitting red light responsive to the green light. Each of the primary light sources is made from an InGaN layer disposed between a p-type GaN layer and an n-type GaN layer. The secondary light sources are made from AlGaInP. The primary light source and the secondary light source can be disposed on opposite sides of a sapphire substrate. Alternatively, the second light source is disposed on the n-type GaN layer of the primary light source. The second light sources may comprise micro-rods of AlGaInP of same or different compositions.

U.S. Pat. No. 7,049,641 to Pan discloses the design, fabrication, and use of semiconductor devices that employ deep-level transitions (i.e., deep-level-to-conduction-band, deep-level-to-valence-band, or deep-level-to-deep-level) to achieve useful results. A principal aspect of the invention involves devices in which electrical transport occurs through a band of deep-level states and just the conduction band (or through a deep-level band and just the valence band), but where significant current does not flow through all three bands. This means that the deep-state is not acting as a non-radiative trap, but rather as an energy band through which transport takes place. Advantageously, the deep-level energy-band may facilitate a radiative transition, acting as either the upper or lower state of an optical transition.

Discussion of wide bandgap materials and the processing thereof are discussed in U.S. Pat. No. 5,145,741; U.S. Pat. No. 5,391,841; U.S. Pat. No. 5,793,042; U.S. Pat. No. 5,837,607; U.S. Pat. No. 6,025,609; U.S. Pat. No. 6,054,375; U.S. Pat. No. 6,271,576, U.S. Pat. No. 6,670,693, U.S. Pat. No. 6,930,009, U.S. Pat. No. 6,939,748, U.S. Pat. No. 7,013,695, U.S. Pat. No. 7,237,422, U.S. Pat. No. 7,268,063, U.S. Pat. Nos. 7,419,887 and 7,618,880 are hereby incorporated by reference into the present application.

Therefore, it is an objective of this invention to provide an energy conversion device within an insulator and method of making comprising a solid state energy conversion device formed in situ within an insulating material.

Another objective of this invention is to provide an energy conversion device within an insulator and method of making that is incorporated into a light emitting device to produce electromagnetic radiation upon the application of electrical power.

Another objective of this invention is to provide an energy conversion device within an insulator and method of making that is incorporated into a photovoltaic device to produce electrical power upon the application of electromagnetic radiation.

Another objective of this invention is to provide an energy conversion device within an insulator and method of making that is incorporated into a photovoltaic device and a solar liquid heater for providing electrical power and heated liquid upon the application of electromagnetic radiation.

Another objective of this invention is to provide an energy conversion device within an insulator and method of making that is incorporated into a photovoltaic device and a solar liquid heater for providing electrical power and for treating water upon the application of electromagnetic radiation.

Another objective of this invention is to provide an energy conversion device and method of making that incorporates a process for doping conventional and unconventional dopants in indirect wide bandgap semiconductors to create efficient radiative states to provide an efficient solid state energy conversion device.

Another objective of this invention is to provide an energy conversion device and method of making that incorporates combinations of dopants that enable the tuning of the energy conversion device to a white light sensitivity of the solid state energy conversion device.

Another objective of this invention is to provide an energy conversion device formed within a one-piece substrate.

Another objective of this invention is to provide a process for making an energy device that is low cost and may be fabricated in large surface areas.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to a process for making a solid-state energy device from an insulating substrate comprising the steps of providing a substrate of an insulating material having a first surface and a second surface. A portion of the insulating material of the substrate is converted into a first type wide bandgap semiconductor material. An adjacent portion of the insulating material of the substrate is converted into a second type wide bandgap semiconductor material in contact with the first type wide bandgap semiconductor material. A first conductor is provided in electrical contact with the first type wide bandgap semiconductor material. A second conductor is provided in electrical contact with the second type wide bandgap semiconductor material.

In a more specific embodiment of the invention, the solid-state energy device is a photovoltaic energy device for providing electrical power between the first and second conductors upon impingement of electromagnetic radiation. In the alternative, the solid-state energy device is a light emitting energy device for emitting electromagnetic radiation upon the application of electrical power between the first and second conductors.

In another specific embodiment of the invention, the invention is incorporated into the process for making a solid-state energy device from an insulating substrate comprising providing a substrate of an insulating material having a first surface and a second surface. A region of the insulating material of the substrate is converted into a wide bandgap semiconductor material. A first conductor is formed in the wide bandgap semiconductor material. A first portion of the wide bandgap semiconductor material is converted into a first type wide bandgap semiconductor material in contact with the first conductor. A second portion of the wide bandgap semiconductor material is converted into a second type wide bandgap semiconductor material in contact with the first wide bandgap semiconductor material. A second conductor is formed in contact with the second type wide bandgap semiconductor material.

The invention is also incorporated into a solid-state energy device comprising a substrate of an insulating material having a first surface and a second surface. A first conductor is located inside of the substrate between the first and second surfaces of the substrate. A first type wide bandgap semiconductor material is located inside of the substrate in contact with the first conductor. A second type wide bandgap semiconductor material located inside of the substrate in contact with the first type wide bandgap semiconductor material. A second conductor is located in contact with the second type wide bandgap semiconductor material.

In another embodiment of the invention, the invention is incorporated into a solid-state energy conversion device comprising a one-piece insulating substrate. A photovoltaic device is formed within the one-piece insulating substrate for enabling electromagnetic radiation propagating into the one-piece insulating substrate to impinge upon the photovoltaic device for generating electrical power.

In a further embodiment of the invention, the invention is incorporated into a solid-state energy conversion device comprising a one-piece insulating substrate. A light-generating device is formed within the one-piece insulating substrate for propagating electromagnetic radiation from the one-piece insulating substrate to impinge upon the application of electrical power.

In still a further embodiment of the invention, the invention is incorporated into a solid-state energy conversion device comprising a one-piece insulating substrate. An energy conversion device is formed within the one-piece insulating substrate for converting energy between electromagnetic radiation and electrical power. A transparent wave guide is affixed to the one-piece insulating substrate for directing electromagnetic radiation relative to the energy conversion device formed within the one-piece insulating substrate.

In an alternate embodiment of the invention, the invention is incorporated into an energy device for generating electrical power and for heating a liquid upon the impingement of electromagnetic energy. A glass substrate is positioned adjacent to the conduit receiving the liquid. A photovoltaic device is disposed within the glass substrate for enabling a first wavelength of the electromagnetic radiation to propagate through the glass substrate to impinge upon the conduit to heat the liquid and for enabling a second wavelength of the electromagnetic radiation to be absorbed by the photovoltaic device for generating electrical power.

In still a further embodiment of the invention, the invention is incorporated into an energy device for generating electrical power upon the impingement of electromagnetic energy in combination with a solar water heater for the heat purification of water through solar radiation.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 1 is an isometric view of a building structure having glass windows incorporating the energy conversion device of the present invention;

FIG. 2 is an enlarged sectional view along line 2-2 in FIG. 1;

FIG. 3 is an enlarged sectional view along line 3-3 in FIG. 1;

FIG. 13 illustrates a portion of an apparatus for converting an insulating substrate into components of the energy conversion device through the use of a thermal energy beam in the presence of a doping gas;

FIG. 14 illustrates an alternate portion of an apparatus for converting an insulating substrate into components of the energy conversion device through the use of a thermal energy beam in the presence of a doping gas;

Similar reference characters refer to similar parts throughout the several Figures of the drawings.

DETAILED DISCUSSION

Figure 4:
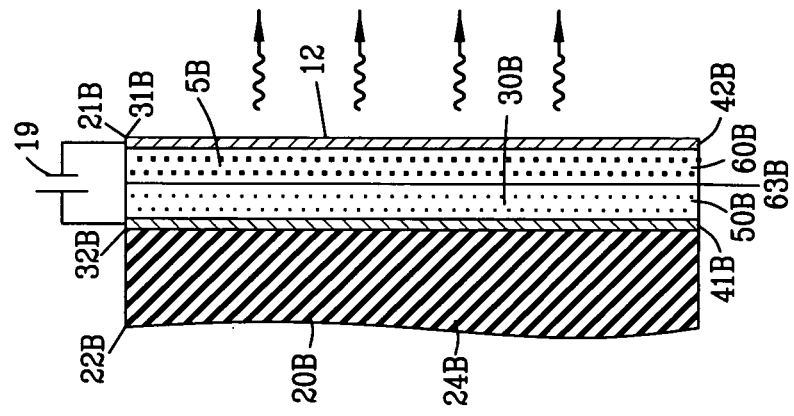
FIG. 4 is a magnified view of a portion of FIG. 2.

FIG. 1 illustrates the solid-state energy device 5 of the present invention located in a building structure 8. The building structure 8 includes a plurality of windows 10 including windows 11 and 12. The window 11 is mounted between window support 13 and 14 whereas window 12 is mounted between window supports 15 and 16. In this example, the solid-state energy device 5 is incorporated into a solid-state energy device 5A located in window 11 as well as a solid-state energy device 5B located in window 12. Although the building structure 8 has been shown as a multi-story building structure, it should be understood that the solid-state energy device 5 maybe any type of building structure.

FIG. 2 is an enlarged sectional view along line 2-2 in FIG. 1 illustrating the window 11. The window 11 comprises an insulating substrate 20A formed from insulating material 24A. A wide bandgap material 30A is formed within the insulating material 24A of the insulating substrate 20A. As will be described in greater detail hereinafter, the solid-state energy device 5A of the present invention is formed within the wide bandgap material 30A of the insulating substrate 20A. In this example, solid-state energy device 5A is a photovoltaic energy device for converting electromagnetic radiation as indicated by the sinusoidal arrows into electrical power as indicated by the ammeter 18.

FIG. 3 is an enlarged sectional view along line 3-3 in FIG. 1 illustrating the window 12. The window 12 comprises an insulating substrate 20B formed from insulating material 24B. A wide bandgap material 30B is formed within the insulating material 24B of the insulating substrate 20B. As will be described in greater detail hereinafter, the solid-state energy device 5B of the present invention is formed within the wide bandgap material 30B of the insulating substrate 20B. In this example, solid state energy device 5B is a light emitting device for converting electrical power as indicate by the battery 19 into electromagnetic radiation as indicated by the sinusoidal arrows.

FIG. 4 is a magnified view of a portion of FIG. 2 illustrating in greater detail the solid-state photovoltaic energy device 5A. The insulating material 24A of the window 11 extends between a first surface 21A and a second surface 22A. The wide bandgap material 30B is formed within the insulating material 24A and extends between a first surface 31A and a second surface 32A. Preferably, the first surface 31A of the wide bandgap material 30B is coincident with the first surface 21A of the insulating material 24A of the window 11.

The solid-state photovoltaic energy device 5A is contained entirely within the wide bandgap material 30A of the insulating substrate 20A. The solid-state photovoltaic energy device 5A comprises a first conductor 41A formed in the wide bandgap material 30A. A first type wide bandgap semiconductor material 50A is formed within the wide bandgap material 30A and in contact with the first conductor 41A. The first type wide bandgap semiconductor material 50A forms an Ohmic contact with the first conductor 41A.

A second type wide bandgap semiconductor material 60A is formed within the wide bandgap material 30A and in contact with the first type wide bandgap semiconductor material 50A. The first type wide bandgap semiconductor material 50A forms a solid-state junction 63 with the second type wide bandgap semiconductor material 60A. A second conductor 42A is formed in electrical contact with the second type wide bandgap semiconductor material 50A. The second type wide bandgap semiconductor material 60A forms an Ohmic contact with the second conductor 42A. The solid-state photovoltaic energy device 5A provides electrical power between the first and second conductors 41 and 42 as indicated by the ammeter 18 upon impingement of electromagnetic radiation as indicated by the sinusoidal arrows.

Figure 5:
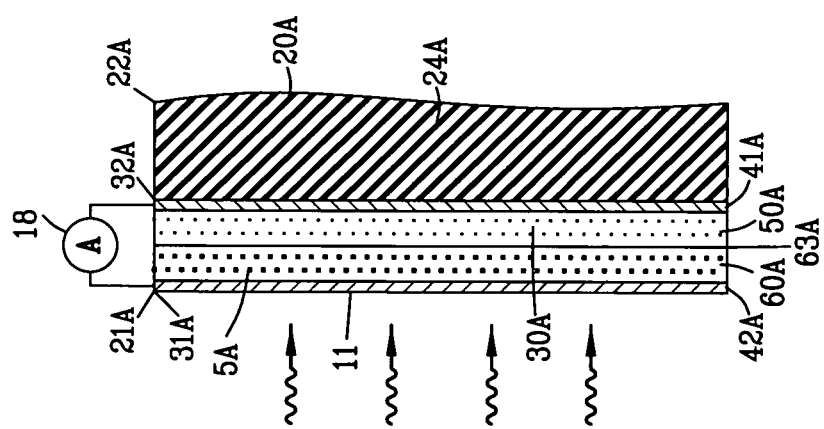
FIG. 5 is a magnified view of a portion of FIG. 3.

FIG. 5 is a magnified view of a portion of FIG. 3 illustrating in greater detail the solid-state photovoltaic energy device 5B. The solid-state photovoltaic energy device 5B comprises a first conductor 41B formed in the wide bandgap material 30B. A first type wide bandgap semiconductor material 50B is formed within the wide bandgap material 30B and in contact with the first conductor 41B. The first type wide bandgap semiconductor material 50B forms an Ohmic contact with the first conductor 41B.

A second type wide bandgap semiconductor material 60B is formed within the wide bandgap material 30B and in contact with the first type wide bandgap semiconductor material 50B. The first type wide bandgap semiconductor material 50B forms a solid-state junction 63B with the second type wide bandgap semiconductor material 60B. A second conductor 42B is formed in electrical contact with the second type wide bandgap semiconductor material 60B. The second type wide bandgap semiconductor material 60B forms an Ohmic contact with the second conductor 42B. The solid-state photovoltaic energy device 5B emits electromagnetic radiation as indicated by the sinusoidal arrows when electrical power is applied between the first and second conductors 41 and 42 as indicated by the battery 19.

Figure 6:
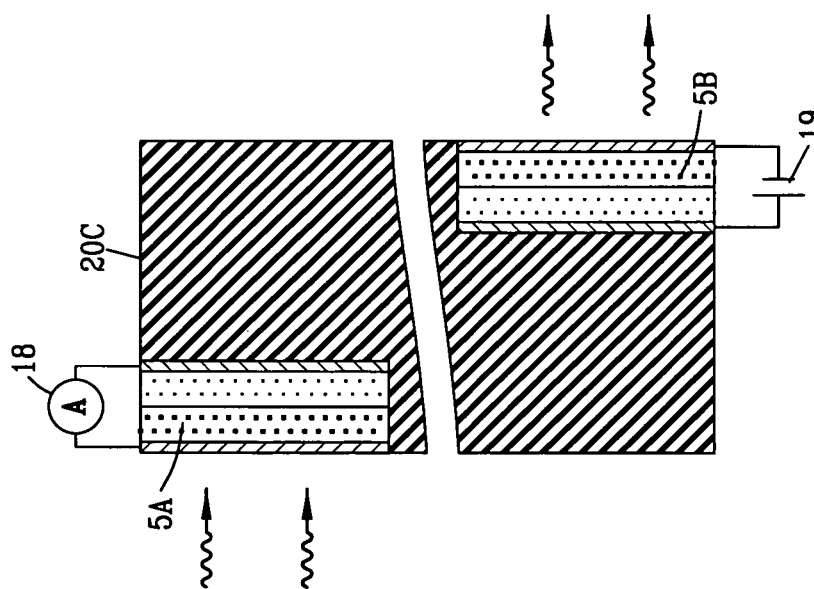
FIG. 6 is a magnified view similar to FIGS. 4 and 5 illustrating the incorporation of both of the energy conversion devices of FIGS. 4 and 5.

FIG. 6 is a magnified view similar to FIGS. 4 and 5 illustrating an insulating substrate 20C incorporating the solid-state photovoltaic energy device 5A of FIG. 4 as well as the solid-state photovoltaic energy device 5B of FIG. 5. It should be appreciated by those skilled in the art that the solid-state photovoltaic energy device 5A and the solid-state light emitting energy device 5B maybe located in various configurations within the insulating substrate 20C.

Figure 7:
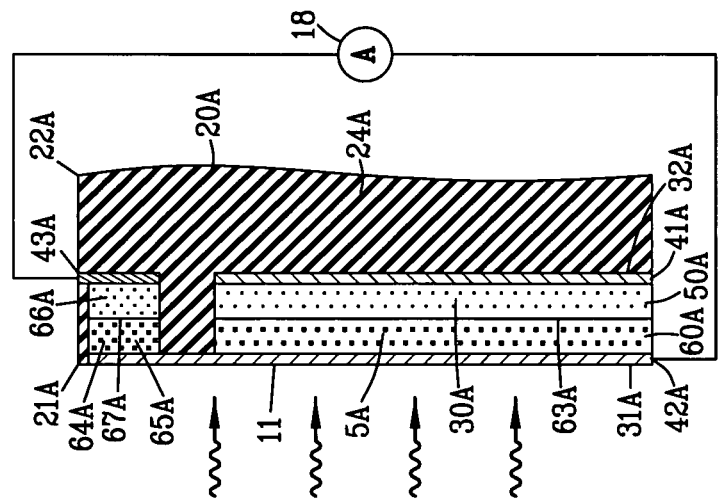
FIG. 7 is an alternate embodiment of FIG. 4 incorporating a diode connected in series with the he energy conversion device.

FIG. 7 is a view similar to FIG. 4 illustrating a solid-state photovoltaic energy device 5C incorporating a diode 64A. The insulating material 24A of the window 11 extends between a first surface 21A and a second surface 22A with the wide bandgap material 30B extending between a first surface 31A and a second surface 32A. The solid-state photovoltaic energy device 5A comprises a first type wide bandgap semiconductor material 50A in contact with the first conductor 41A. The second type wide bandgap semiconductor material 60A forms a solid-state junction 63 with the first type wide bandgap semiconductor material 50A. A second conductor 42A is in electrical contact with the second type wide bandgap semiconductor material 50A.

The diode 64A comprises a third type wide bandgap semiconductor material 65A in contact with the second conductor 42A. A fourth type wide bandgap semiconductor material 66A forms a solid-state junction 67A with the third type wide bandgap semiconductor material 65A. A third conductor 43A is in electrical contact with the fourth type wide bandgap semiconductor material 66A.

Figure 8:
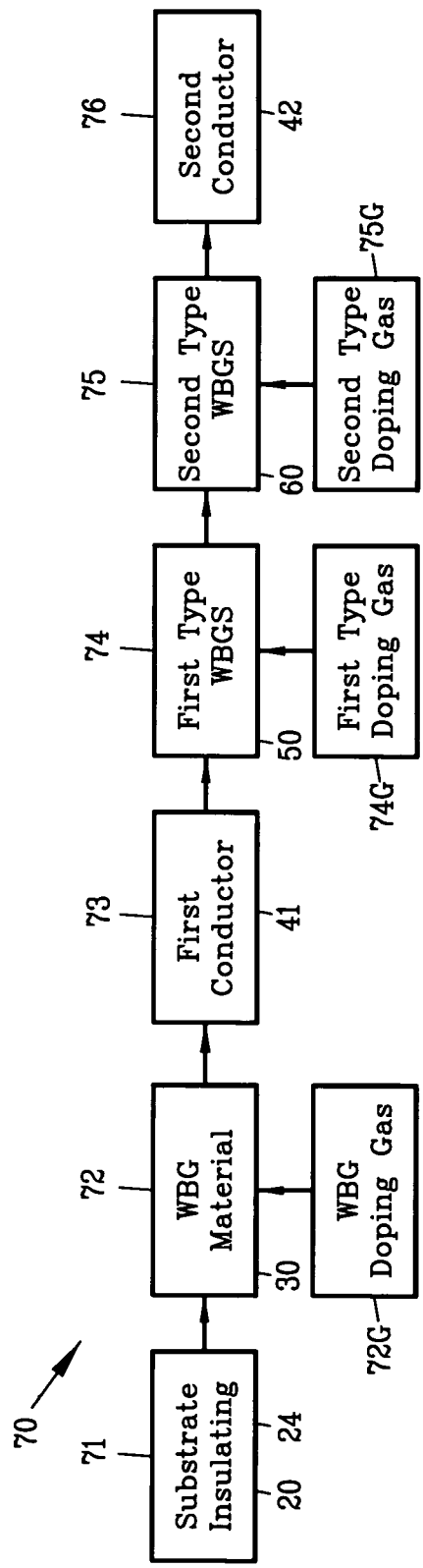
FIG. 8 is a block diagram of the process of making the energy conversion device of the present invention.

The diode 64A is connected in series with the solid-state photovoltaic energy device 5A to prevent reverse current flow through the solid-state photovoltaic energy device 5A. The diode 64A prevents discharge of a load such a battery (not shown) through the solid-state photovoltaic energy device 5A upon a reduced voltage output of the solid-state photovoltaic energy device 5A, FIG. 8 is a block diagram of the process 70 of making the energy conversion device 5 of the present invention. The process 70 of making the energy conversion device 5 is applicable to the process 70 of making the solid-state photovoltaic energy device 5A and the process 70 of making the solid-state light emitting energy device 5B.

Figure 9:
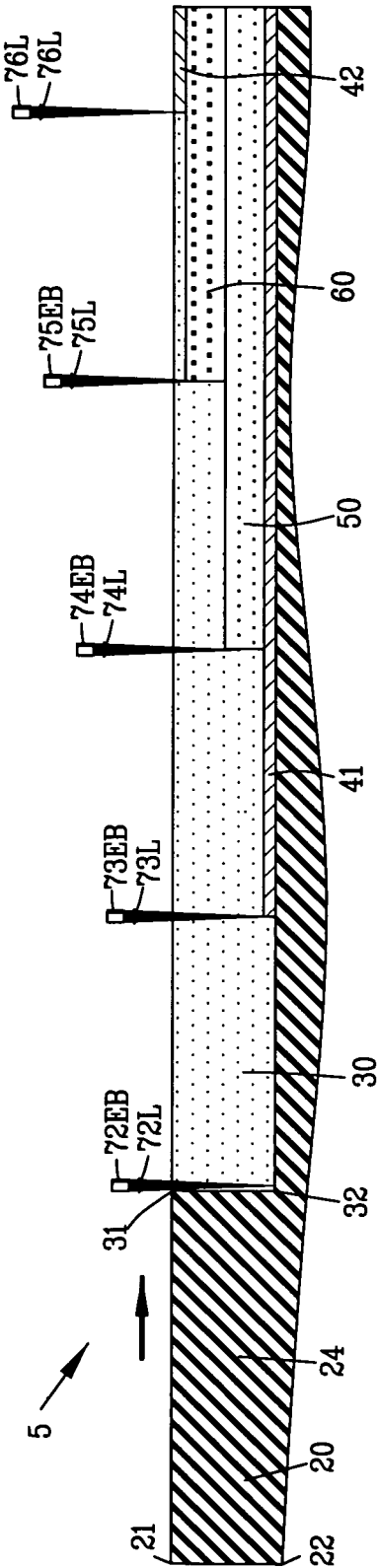
FIG. 9 illustrates the sequence of forming the energy conversion device of the present invention.

FIG. 9 illustrates the sequence of forming the energy conversion device 5 in accordance with the process 70 illustrated in the block diagram of FIG. 8. The process 70 comprises the process step 71 of providing a substrate 20 of an insulating material 24 having the first surface 21 and the second surface 22.

The process 70 includes the process step 72 of applying a wide bandgap forming doping gas 72G to the substrate 20. The process step 72 further includes concentrating a thermal energy beam 72EB inside of the substrate 20 for converting a region of the insulating material 24 between the first and second surfaces 21 and 22 into the wide bandgap semiconductor material 30. Preferably, the thermal energy 72EB is concentrated by focusing the energy beam between the first and second surfaces 21 and 22 of the substrate 20. In this example, the thermal energy is shown as a laser beam focused by a lens 72L between the first and second surfaces 21 and 22 of the substrate 20. In the event the substrate 20 is originally provided as a wide bandgap semiconductor material, then the process step 72 is unnecessary as should be apparent to those skilled in the art.

The process 70 includes the process step 73 of concentrating a first conductor forming thermal energy 73EB inside of the substrate 20 to form a first conductor 41 between the first and second surfaces 31 and 32 of the wide bandgap semiconductor material 30.

The process 70 includes the process step 74 of applying a first type semiconductor doping gas 74G to the substrate 20. The process step 74 further includes concentrating a first type semiconductor forming thermal energy 74EB inside of the substrate 20 to form a first type wide bandgap semiconductor material 50 between the first and second surfaces 31 and 32 of the wide bandgap semiconductor material 30 and in electrical contact with the first conductor 41.

The process 70 includes the process step 75 of applying a second type semiconductor doping gas 75G to the substrate 20. The process step 75 further includes concentrating a second type semiconductor forming thermal energy 75EB inside of the substrate 20 to form a second type wide bandgap semiconductor material 60 between the first and second surfaces 21 and 22 of the wide bandgap semiconductor material 30 and in electrical contact with the first wide type bandgap semiconductor material 50.

The process 70 includes the process step 76 of concentrating a second conductor forming thermal energy 76EB on the first surface 21 of the substrate 20 to form a second conductor 42 in electrical contact with the second type wide bandgap semiconductor material 60.

Figure 10:
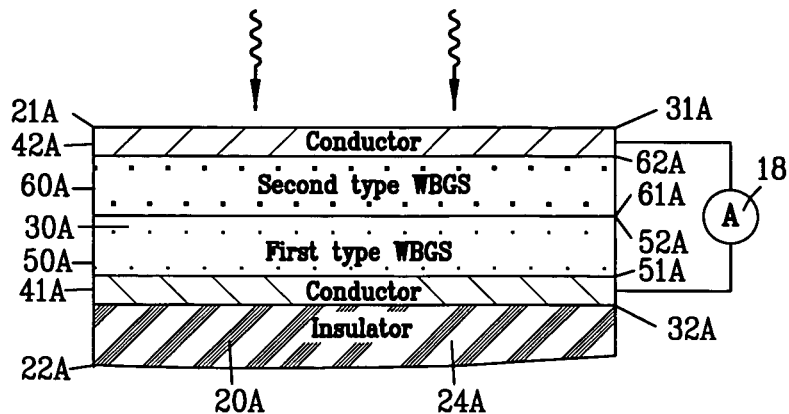
FIG. 10 is a magnified view of a photovoltaic energy conversion device of FIG. 4.

FIG. 10 is a magnified view of a completed photovoltaic energy conversion device 5A of the present invention formed in accordance with the process of FIGS. 8-9. The wide bandgap semiconductor material 30 within the substrate 20 is converted to form the photovoltaic energy conversion device 5A. The photovoltaic energy conversion device 5A is contained completed between the first and second surfaces 21 and 22 of the substrate 20.

Figure 11:
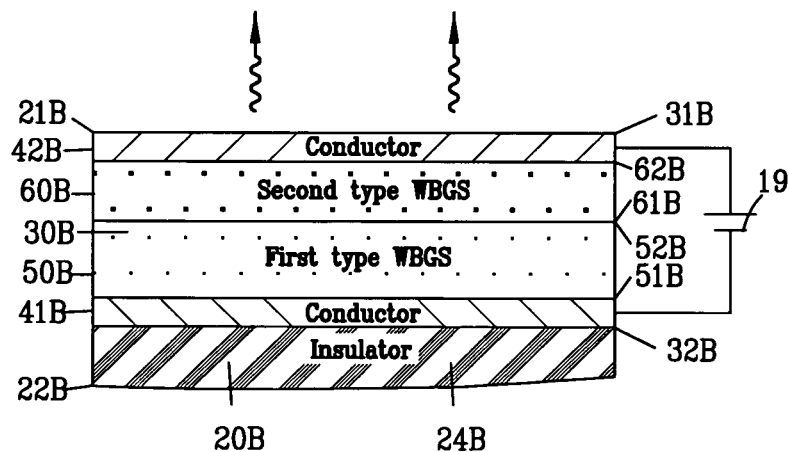
FIG. 11 is a magnified view of a light emitting energy conversion device of FIG. 5.

FIG. 11 is a magnified view of a completed light emitting energy conversion device 5B of the present invention formed in accordance with the process of FIGS. 8-9. The wide bandgap semiconductor material 30 within the substrate 20 is converted to form the light emitting energy conversion device 5B. The light emitting energy conversion device 5B is contained completed between the first and second surfaces 21 and 22 of the substrate 20.

Figure 12:
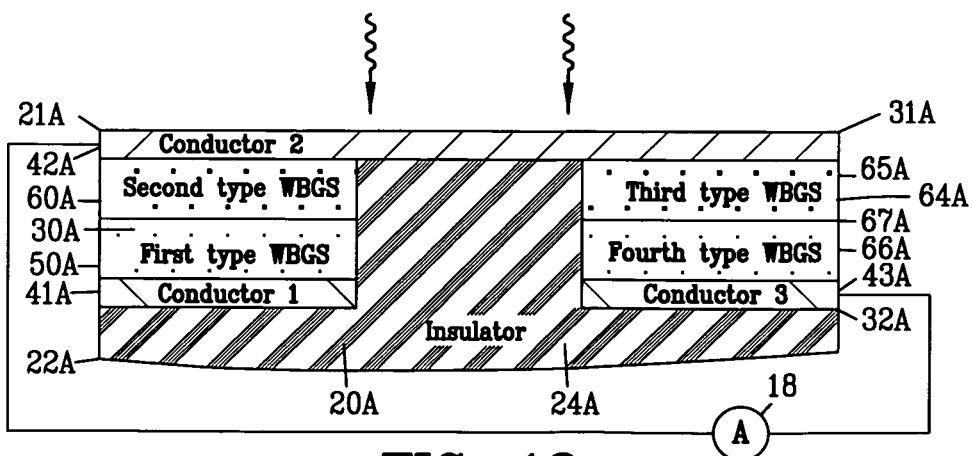
FIG. 12 is a magnified view of a light emitting energy conversion device of FIG. 7.

FIG. 12 is a view similar to FIG. 10 illustrating a completed photovoltaic energy conversion device 5A incorporating the diode 64A formed in accordance with the process of FIGS. 8-9. The wide bandgap semiconductor material 30 within the substrate 20 is converted to form the photovoltaic energy conversion device 5A and the diode 64A. The photovoltaic energy conversion device 5A the diode 64A are contained completed between the first and second surfaces 21 and 22 of the substrate 20.

FIG. 13 illustrates a portion of a first example of an apparatus 80 for fabricating the energy conversion device 5 of the present invention. The apparatus 80 illustrates only a first and a second chamber 81A and 81B for accomplishing the process steps 72 and 73 shown in FIGS. 8 and 9. However, it should be understood that the apparatus 80 includes similar chambers for accomplishing the remaining process steps 74-76 shown in FIGS. 8 and 9.

The first chamber 81A comprises a chamber input 82A and a chamber output 83A with a window 84A communicating with a chamber interior 85A. Plural input gas ports 86A are provided for enabling introduction of the wide bandgap doping gas 72G into the chamber interior 85A. An input gas curtain 87A and an output gas curtain 88A retard the outflow of the wide bandgap doping gas 72G from the chamber interior 85A.

In this embodiment, a first and a second thermal energy beam 72EB1 and 72EB2 are directed through the window 84A onto the substrate 20. In a first mode of operation, the first and second thermal energy beams 72EB1 and 72EB2 are directed onto the substrate 20 to intersect between the first and second surfaces 21 and 22 of the substrate 20. The intersecting first and second thermal energy beams 72EB1 and 72EB2 provide heat between the first and second surfaces 21 and 22 of the substrate 20 as the substrate 20 moves through the first chamber 81A. Heat provided by the first and second thermal energy beams 72EB1 and 72EB2 in the presence of the wide bandgap doping gas 72G within the chamber interior 85A converts the insulating material 24 of the substrate into the wide bandgap semiconductor material 30.

In a second mode of operation, the first and second thermal energy beams 72EB1 and 72EB2 are directed onto the substrate 20 to intersect between the first and second surfaces 21 and 22 of the substrate 20. The first thermal energy beam 72EB1 provides heat within the substrate 20 as the substrate 20 moves through the first chamber 81A. Heat provided by the first thermal energy beam 72EB1 in the presence of the wide bandgap doping gas 72G within the chamber interior 85A converts the insulating material 24 of the substrate into the wide bandgap semiconductor material 30. The second thermal energy beam 72EB2 is used for energizing the dopants to active states. An optional interrogation laser may be added for materials property interrogation and process control as will be explained hereinafter with reference to the second chamber 81B.

The second chamber 81B is similar in design and operation as the first chamber 81A. The second chamber 81B comprises a chamber input 82B and a chamber output 83B with a window 84B communicating with a chamber interior 85B. Plural input gas ports 86B are provided for enabling introduction of a gas into the chamber interior 85B. An input gas curtain 87B and an output gas curtain 88B retard the outflow of any gas from the chamber interior 85B.

In this example, the thermal energy beam 73EB is a laser beam focused between the first and second surfaces 21 and 22 of the substrate 20 by the lens 73L. Heat provided by the thermal energy beam 73EB within the chamber interior 85A converts the wide bandgap semiconductor material 30 into the first conductor 41 as the substrate moves through the second chamber 81B. Typically a doping gas is not used for converting the wide bandgap semiconductor material 30 into the first conductor 41.

An optional interrogation laser 73IB has been added for materials property interrogation and process control of the thermal energy beam 73EB based on the properties of the first conductor 41 during the formation thereof.

Preferably, the interrogation laser 73IB is a Helium-Neon (He—Ne) laser having a wavelength of 632.5 nm. The interrogation laser 73IB is able to measure processed material composition before, during and after doping and conductor synthesis process. The interrogation laser 73IB is able to measure the refractive index of the interrogated material. Changes in the refractive index of the interrogated material are feed back through a control 89C to control the operation of the thermal energy beam 73EB. The use of the interrogation laser 73IB enables larges substrate areas to be processed with very uniform properties after the conversion process. It should be understood that the interrogation laser 73IB may be added to any of the stages shown in FIGS. 8 and 9. A fuller explanation of the may be found in our copending patent application Ser. No. 11/340,883 filed Jan. 26, 2006 which is incorporated by reference as if fully set forth herein.

FIG. 14 illustrates a portion of a second example of an apparatus 90 for fabricating the energy conversion device 5 of the present invention. The apparatus 90 illustrates only a first and a second chamber 91A and 91B for accomplishing the process steps 72 and 73 shown in FIGS. 8 and 9. However, it should be understood that the apparatus 90 includes similar chambers for accomplishing the remaining process steps 74-76 shown in FIGS. 8 and 9.

The first chamber 91A comprises a chamber input 92A and a chamber output 93A with an aperture 94A communicating with a chamber interior 95A. An annular input gas port 96A surrounds the aperture 94A for introducing the wide bandgap doping gas 72G into the chamber interior 95A. An annular output gas port 98A surrounds the annular input gas port 96A for recovering excess bandgap doping gas 77 from the chamber interior 95A.

A thermal energy beam 72EB is directed through the aperture 94A to be concentrated between the first and second surfaces 21 and 22 of the substrate 20. In this example, the thermal energy beam 72EB is focused by the lens (not shown) between the first and second surfaces 21 and 22 of the substrate 20. The focused laser beams 72EB impinges upon the substrate 20 as the substrate 20 as the chamber 91 move relative to the substrate 20. Heat provided by the thermal energy beam 72EB in the presence of the wide bandgap doping gas 72G within the chamber interior 95A converts the insulating material 24 of the substrate into the wide bandgap semiconductor material 30. The laser beam can be focused to small diameters using lenses or can be expanded by using beam expanders for large area irradiation. Furthermore, the laser beam can be scanned across the substrate 20. The laser beam can be a pulsed at a specific location on the substrate 20.

The second chamber 91B is similar in design and operation as the first chamber 91A. The second chamber 91B comprises a chamber input 92B and a chamber output 93B with an aperture 94B communicating with a chamber interior 95B. An annular input gas port 96B surrounds the aperture 94B for introducing any gas into the chamber interior 95A. An annular output gas port 98A surrounds the annular input gas port 96A for recovering any excess gas from the chamber interior 95A. The thermal energy beam 73EB is focused through the aperture 94B to be concentrated between the first and second surfaces 21 and 22 of the substrate 20. The focused laser beam 73EB impinges upon the substrate 20. Heat provided by the thermal energy beam 73EB converts the wide bandgap semiconductor material 30 into the first conductor 41 as the chamber 91B moves relative to the substrate 20. Typically a doping gas is not used for converting the wide bandgap semiconductor material 30 into the first conductor 41.

Figure 15:
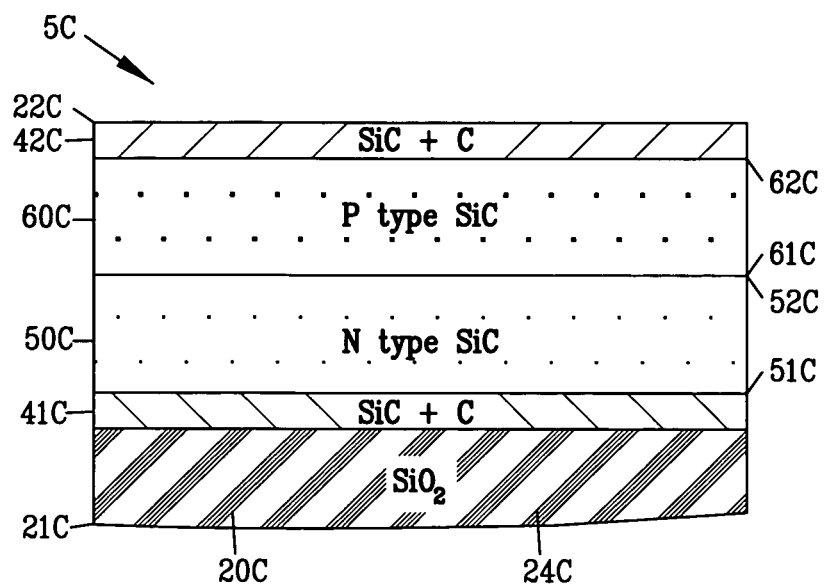
FIG. 15 illustrates a specific example of the energy conversion device of the present invention formed in an insulating glass substrate.

FIG. 15 illustrates a first specific example of the solid-state energy device 5C within an insulating substrate 20C having a first surface 21C and a second surface 22C. The insulating substrate 20C is formed from an insulating glass material ($SiO_2$) 24C.

A wide bandgap forming doping gas selected from the group consisting of acetylene ($C_2H_2$), ethylene ($C_2H_4$) and methane ($CH_4$) is applied to the glass substrate ($SiO_2$) 20C. A wide bandgap forming thermal energy is concentrated inside of the substrate 20C for converting a region of the insulating glass material ($SiO_2$) 24C between the first and second surfaces 21C and 22C into a silicon carbide material (SiC) 30C. The wide bandgap forming doping gas contributes carbon (C) to form the (SiC).

A first conductor forming thermal energy is concentrated inside the silicon carbide material (SiC) 30C to form a first conductor 41C within the silicon carbide material (SiC) 30C. The thermal energy concentrated inside the silicon carbide material (SiC) 30C dissociates the silicon atoms from the carbon atoms to enrich the carbon content of the silicon carbide material (SiC) 30C to form the first conductor 41C.

The first conductor 41C can range in composition from a carbon material (C) to a silicon (Si)-carbon (C)-oxygen (O) conductive material. A complete discussion of this enrichment process is set forth in my U.S. Pat. No. 5,145,741 and my U.S. Pat. No. 6,670,693 which are incorporated by reference into the present specification as if fully set forth herein.

A first type semiconductor forming doping gas selected from the group consisting of nitrogen ($N_2$) and diethyl selenium (C2H5)2Se is applied to the silicon carbide material (SiC) 30C. A first type semiconductor forming thermal energy is concentrated inside of the silicon carbide material (SiC) 30C to form an N-type silicon carbide semiconductor material (N—SiC) 50C within the silicon carbide wide material (SiC) 30C and in Ohmic contact with the first conductor 41C.

A second type semiconductor forming doping gas selected from the group consisting of trimethyl aluminum $(CH_3)_3Al$ and Bis(ethyl-benzene)-chromium ($C_{16}H_{20}Cr$) is applied to silicon carbide material (SiC) 30C. A second type semiconductor thermal energy is concentrated inside of the silicon carbide material (SiC) 30C to form a P-type silicon carbide semiconductor material (P—SiC) 60C within the silicon carbide wide bandgap material (SiC) 30C forming a P—N junction the N-type silicon carbide semiconductor material (N—SiC) 50C.

The preferred dopants create a band of deep level states that do not behave as nonradiative traps but as an energy band through which charge carrier transport occurs. These deep level states behave as an upper or lower state of the optical transition and essentially can convert indirect bandgap materials to direct bandgap materials.

Figure 17:
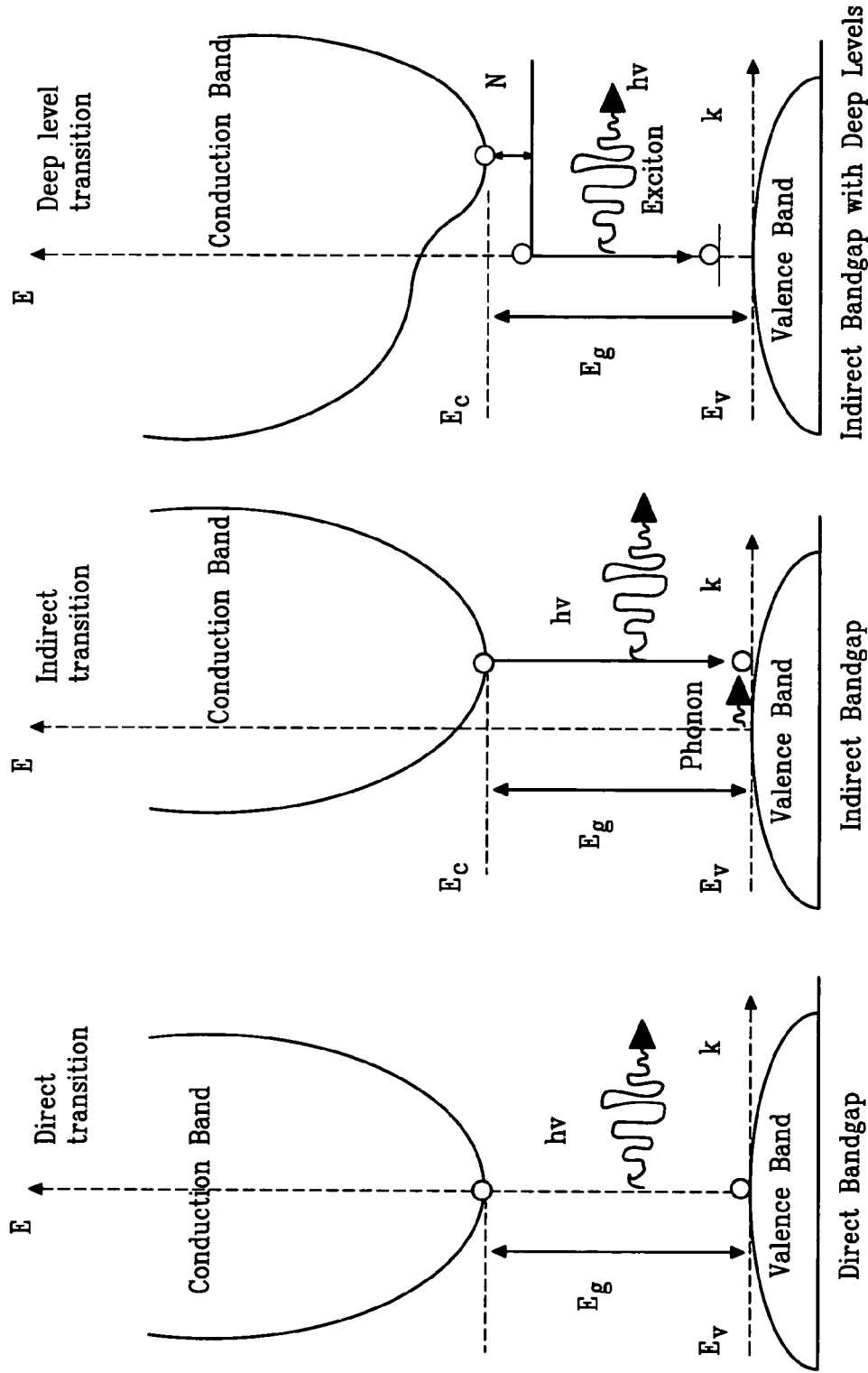
FIG. 17A is a graph illustrating a direct transition between the valence band and the conduction band of a semiconductor.
FIG. 17B is a graph illustrating an indirect transition between the valence band and the conduction band of a semiconductor.
FIG. 17C is a graph illustrating a deep level transition between the valence band and the conduction band of a semiconductor.

FIG. 17A is a graph illustrating a direct transition between the valence band and the conduction band of a semiconductor. In the direct transition, essentially all energy between the valence band and the conduction band is converted into photons.

FIG. 17B is a graph illustrating an indirect transition between the valence band and the conduction band of a semiconductor. In the indirect transition, essentially a part of the energy between the valence band and the conduction band is converted into photons and a part of the energy between the valence band and the conduction band converted into phonons.

FIG. 17C is a graph illustrating a deep level transition between the valence band and the conduction band of a semiconductor. In the deep level transition, essentially all energy between the valence band and the conduction band is converted into photons. The deep levels can produce optically active, e.g., direct bandgap semiconductor behavior. FIGS. 17A-17C illustrating the direct bandgap, the indirect bandgap and the indirect bandgap to direct bandgap schematically shows this effect. More specifically, laser doping can convert indirect bandgap semiconductors to direct bandgap semiconductors by intentionally inducing strain to alter electron momentum states. An indirect bandgap semiconductor has a conduction band bottom that does not occur at momentum (k)=0 while the top of the valence band does occur at k=0. Therefore energy released during electron recombination with a hole is converted primarily into a phonon (additional momentum), a quasi-particle which is a quantized sound wave; e.g. Si, GaP, SiC. A direct bandgap semiconductor has a conduction band bottom and valence band top occurring at the momentum k=0. Therefore energy released during band-to-band electron recombination with a hole is converted primarily into photon radiation (radiant recombination) exhibiting a wavelength determined by the energy gap; e.g. GaAs, InP, GaN; no extra momentum is required. Direct bandgap semiconductors are sometimes referred to as "optically active" and indirect as "optically inactive". Laser doping where the dopant has a valence greater than the highest valence atom of the comprising the parent wide bandgap semiconductor can transform the SiC indirect wide bandgap semiconductor into a direct bandgap semiconductor; dopants with a valence 2 or greater than the highest valence atom comprising the parent wide bandgap semiconductor are preferred. This doping induces strain which alters the momentum state of the electrons and facilitates the transfer of electron-hole recombination between the conduction and valence bands with no additional momentum. U.S. Pat. No. 7,049,641 issued to Pan discloses that phonons are not required for deep level transitions to the conduction band, to the valence band or deep level to deep level energy levels.

A second conductor forming thermal energy is concentrated inside the silicon carbide material (SiC) 30C to form a second conductor 42C in Ohmic contact with the P-type silicon carbide semiconductor material (P—SiC) 60C. The thermal energy concentrated inside the silicon carbide material (SiC) 30C enriches the carbon content of the silicon carbide material (SiC) 30C to form the second conductor 42C. The second conductor 42C is formed in a manner similar to the first conductor 41C.

Table 1 set forth representative processing parameters for converting the silicon carbide (SiC) 24C to a white light emitting SiC region.

TABLE 1

| Process | Laser Source | Power (W) | Pulse repetition rate (KHz) | Pulse Energy (mJ/pulse) | Fluence (J/cm$^2$) | Spot size (μm) | # of passes/shots | Scanning speed (mm/sec) | Gas Environment |
|---|---|---|---|---|---|---|---|---|---|
| SiO$_2$ conversion to SiC | CO$_2$ 9300 nm wavelength | — | — | — | <1.6 × 10$^4$ | — | — | — | Methane 30 psi |
| Conductor Synthesis | Nd:YAG 532 nm wavelength | — | 2-10 | 3.15 | — | — | 1 | 20 | Ambient |
| Doping | | | | | | | | | |
| Cr (P-type) | Nd:YAG 1064 nm wavelength | 11.6 | 4 | — | — | 65 | 1 | 0.8 | Bis (ethyl benzene)-chromium, argon 30 psi |
| Al (P-type) | Nd:YAG 1064 nm wavelength | 11.5-12 | 5 | — | — | 65 | 2 | 0.5 | Trimethyl aluminum, 30 psi |
| N (N-type) | ArF Excimer 193 nm wavelength | — | 10 | 200 | 0.556 | — | 1 | — | N$_2$ 30 psi |

Figure 16:
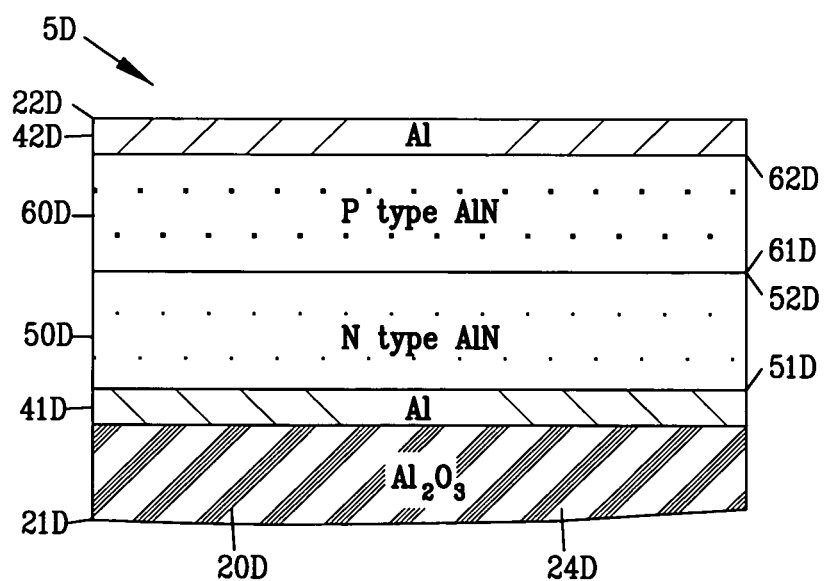
FIG. 16 illustrates a specific example of the energy conversion device of the present invention formed in an aluminum oxide substrate.

FIG. 16 illustrates a second specific example of the solid-state energy device 5D within an insulating substrate 20D having a first surface 21D and a second surface 22D. The insulating substrate 20D is formed from an insulating ceramic material such as aluminum oxide commonly known alumina (Al$_2$O$_3$) 24D.

A wide bandgap forming doping gas is applied to the alumina (Al$_2$O$_3$) 24D to convert a portion of the alumina (Al$_2$O$_3$) 24D into a wide bandgap aluminum nitride material (AlN). In one example, a first carbon source gas to remove oxygen and a second nitrogen source doping gas are applied to the alumina (Al$_2$O$_3$) 24D. The first carbon source gas is selected from the group consisting of methane (CH$_4$), acetylene (C$_2$H$_2$) and ethylene (C$_2$H$_4$). Preferably, the second nitrogen source doping gas is nitrogen (N$_2$).

A wide bandgap forming thermal energy is concentrated inside of the substrate 20D for converting a region of the alumina material (Al$_2$O$_3$) 24D into a wide bandgap material aluminum nitride (AlN) 30D. The first carbon source gas applied to the alumina (Al$_2$O$_3$) 24D removes oxygen (O) from the alumina (Al$_2$O$_3$) 24D and produces carbon oxide, CO or CO$_2$. The second nitrogen source doping gas donates nitrogen to the oxygen deficient alumina (Al$_2$O$_3$) 24D to form the wide bandgap aluminum nitride material (AlN) 30D. The first carbon source gas and the second nitrogen source doping gas may be applied serially or simultaneously to the alumina (Al$_2$O$_3$) 24D.

A first conductor forming thermal energy is concentrated inside the insulating substrate 20D to form a first conductor 41D within the aluminum nitride material (AlN) 30D. The thermal energy concentrated inside the aluminum nitride (AlN) 30D dissociates the nitrogen atoms from the aluminum atoms to enrich the aluminum content of the aluminum nitride material (AlN) 30D to form the first conductor 41D. The first conductor 41D can range in composition from an aluminum conductive material (Al) to an aluminum (Al)-nitrogen (N)-oxygen (O) conductive material. A complete discussion of this enrichment process is set forth in U.S. Pat. No. 5,145,741 and U.S. Pat. No. 6,670,693 which are incorporated by reference into the present specification as if fully set forth herein.

A first type semiconductor forming doping gas selected from the group consisting of and oxygen (O$_2$) and silane (SiH$_4$), for providing silicon, is applied to the substrate 20D.

A first type semiconductor forming thermal energy is concentrated inside of the substrate 20 to form an N-type aluminum nitride semiconductor material (N—AlN) 50D within the wide bandgap aluminum nitride material (AlN) 30 between the first and second surfaces of the substrate 20D. The N-type aluminum nitride semiconductor material (N—AlN) 50D is formed in Ohmic contact with the first conductor 41D.

A second type semiconductor forming doping gas selected from the group consisting of ethylene (C$_2$H$_4$), methane (CH$_4$), acetylene (C$_2$H$_2$), for providing carbon, and Bis-magnesium dihydrate [Mg(TMHD)$_2$], for providing magnesium, is applied to the substrate 20D.

A second type semiconductor thermal energy is concentrated inside of the substrate 20 to form a P-type aluminum nitride semiconductor material (P—AlN) 60D within the wide bandgap aluminum nitride material (AlN) 30D between the first and second surfaces 21D and 22D of the substrate 20D. The P-type aluminum nitride semiconductor material (P—AlN) 60D forms a P—N junction with the N-type aluminum nitride semiconductor material (N-ALN) 50D.

A second conductor forming thermal energy is concentrated on the substrate 20D to form a second conductor 42D in Ohmic contact with the P-type aluminum nitride semiconductor material (P—AlN) 60D. The second conductor 42D is formed in a manner similar to the first conductor 41D.

Table 2 set forth representative processing parameters for converting the alumina material (Al$_2$O$_3$) 24D to an aluminum nitride material (AlN) 30 direct energy conversion region.

TABLE 2

| Process | Laser Source | Power (W) | Pulse repetition rate (KHz) | Peak Pulse Intensity (W/cm) | Pulse Energy (mJ) | Fluence (J/cm$^2$) | Spot size (μm) | # of passes/ shots | Scanning speed (mm/sec) | Gas Environment |
|---|---|---|---|---|---|---|---|---|---|---|
| Al$_2$O$_3$ conversion to AlN | Nd:YAG 1064 nm wavelength | — | — | — | — | <750 | — | — | — | Methane + N$_2$ 30 psi |
| Conductor Synthesis Doping | Nd:YAG 1064 nm wavelength | — | 2-10 | — | 8.05 | — | — | 1 | 2 | Ambient |
| Si (N-type) | Nd:YAG 532 nm wavelength | 15 | 4 | — | — | — | 300 | 1 | 0.9 | Silane 30 psi |
| Mg (P-type) | Nd:YAG 532 nm wavelength | 15 | 4.2 | — | — | — | 300 | 1 | 0.9 | Mg(TMHD)$_2$ 30 psi |

Figure 18:
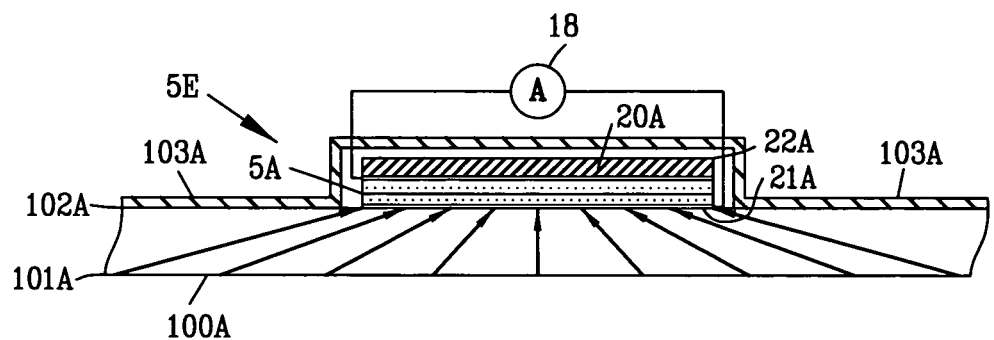
FIG. 18 illustrates the photovoltaic energy device of the present invention coupled to a wave guide.

FIG. 18 illustrates an energy conversion device 5E. In this example, the photovoltaic energy conversion device 5A of the present invention is coupled to a wave guide 100A. A one-piece insulating substrate 20A has a first and a second surface 21A and 22A. The photovoltaic device 5A is formed within the one-piece insulating substrate 20A between the first and second surfaces 21A and 22A.

A transparent wave guide 100A is defined between a first and a second surface 101A and 102A. The transparent wave guide 100A may be formed from various materials such as glass materials, polymeric materials or any other type of suitable material. The second surface 102A of the transparent wave guide 100A is bonded to the first surface 21A the one-piece insulating substrate 20A. Preferably, the transparent wave guide 100A is bonded to the first surface 21A of the insulating substrate 20A by a laser fusion process or any other suitable means. A reflecting material 103A is affixed to the second surface 102A of the transparent wave guide 100A.

The transparent wave guide 100A acts as a concentrator for directing electromagnetic radiation into the photovoltaic energy device 5A formed within the one-piece insulating substrate 20A. The transparent wave guide 100A effectively increases the surface area of the photovoltaic energy device 5A thus increasing the electric power of the photovoltaic energy device 5A.

Figure 19:
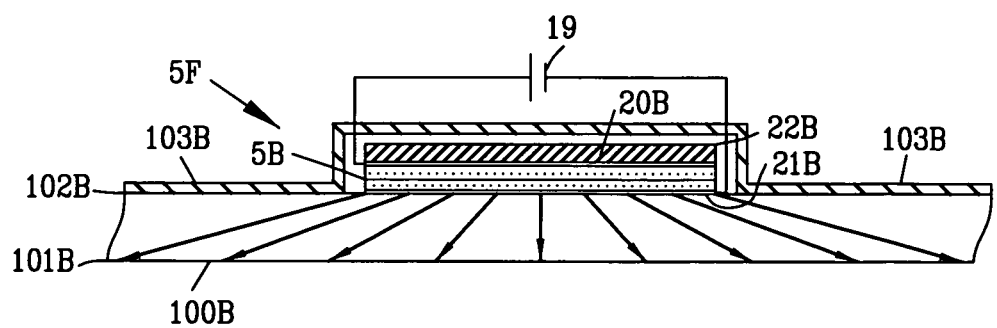
FIG. 19 illustrates the light emitting energy device of the present invention coupled to a wave guide.

FIG. 19 illustrates an energy conversion device 5F. In this example, the light emitting energy device 5B of the present invention is coupled to a wave guide 100B. A one-piece insulating substrate 20B has a first and a second surface 21B and 22B. The light emitting energy device 5B is formed within the one-piece insulating substrate 20B between the first and second surfaces 21B and 22B.

A transparent wave guide 100B is defined between a first and a second surface 101B and 102B. The transparent wave guide 100B may be formed from various materials such as glass materials, polymeric materials or any other type of suitable material. The second surface 102B of the transparent wave guide 100B is bonded to the first surface 21B the one-piece insulating substrate 20B. Preferably, the transparent wave guide 100B is bonded to the first surface 21B of the insulating substrate 20B by a laser fusion process or any other suitable means. A reflecting material 103B is affixed to the second surface 102B of the transparent wave guide 100B.

The transparent wave guide 100B acts as a diffuser for diffusing electromagnetic radiation from the light emitting energy device 5B formed within the one-piece insulating substrate 20B. The transparent wave guide 100B effectively increases the surface area of electromagnetic radiation from the light emitting energy device 5B.

Figure 20:
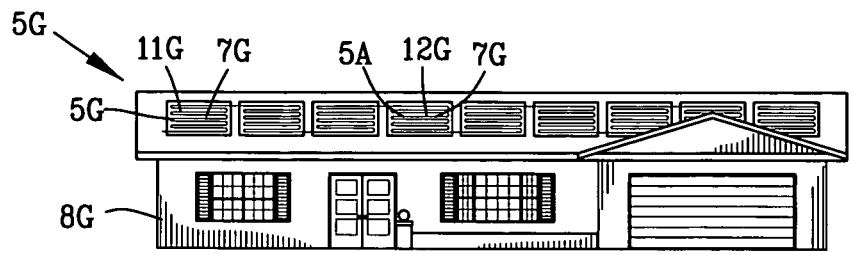
FIG. 20 illustrates an energy conversion device of the present invention in the form of a combined photovoltaic device and a solar liquid heater.

FIG. 20 illustrates a plurality of energy conversion devices 5G of the present invention located in a building structure 8G. The plurality of energy conversion devices 5G are shown located on the roof of the building structure 8G. The plurality of energy conversion devices 5G include the energy conversion devices 5G identified as units 11G and 12G. Each of the energy conversion devices 5G comprises a photovoltaic energy conversion device 5A in combination with a solar liquid heater 7G. The solar liquid heaters 7G of the plurality of energy conversion device 5G are shown interconnected in a conventional manner for heating a liquid upon the impingement of electromagnetic radiation from the sun. Although the plurality of energy conversion devices 5G are shown mounted on the roof of the building structure 8G, it should be understood that the plurality of energy conversion devices 5G may be mounted in any appropriate location.

Figure 21:
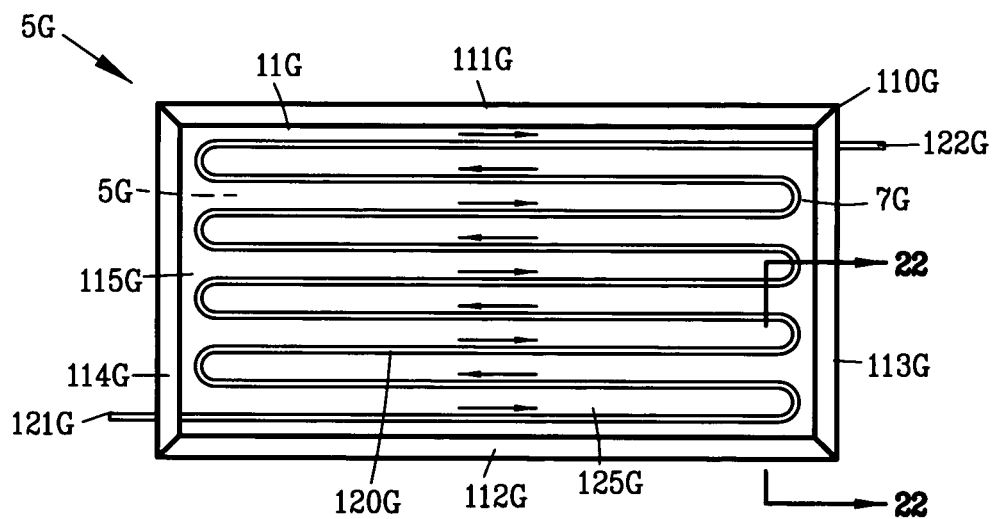
FIG. 21 is a magnified view of a portion of FIG. 20.
Figure 22:
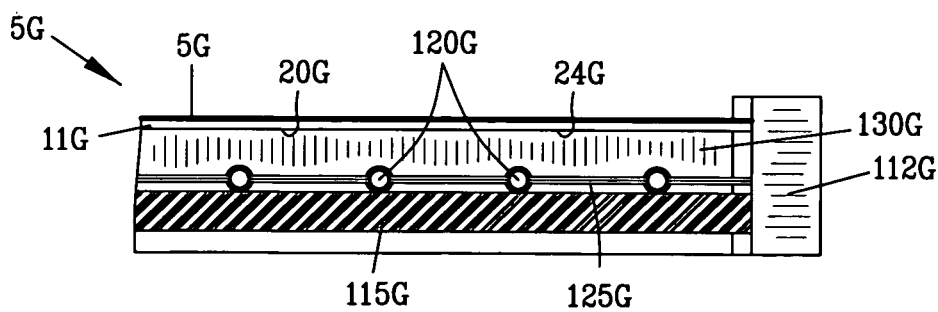
FIG. 22 is an enlarged sectional view along line 22-22 in FIG. 21.

FIGS. 21 and 22 are more detailed views of the energy conversion device 5G and the solar liquid heater 7G of unit 11G. The energy conversion device 5G includes a frame support 110G comprising side supports 111G and 112G and end supports 113G and 114G. A back support 115G interconnects the side supports 111G and 112G and end supports 113G and 114G. Preferably, the back support 115G is made of an insulating material as best shown in FIG. 22.

The solar liquid heater 7G comprises a liquid conduit 120G extending between an input 121G and an output 122G. Preferably, the liquid conduit 120G is formed in a serpentine path and in thermal contact with a solar collector 125G. The inputs 121G and the outputs 122G enable a plurality of the solar liquid heater 7G to be interconnected as shown in FIG. 19. The solar collector 125G provides support for the liquid conduit 120G. In addition, the solar collector 125G provides an increased surface area for receiving and collecting solar electromagnetic radiation. The frame support 110G supports the solar collector 125G and the liquid conduit 120G within the side supports 111G and 112G and end supports 113G and 114G.

The energy conversion device 5G comprises an insulating substrate 20G formed from an insulating glass material 24G. The frame support 110G supports the insulating substrate 24G with the photovoltaic energy conversion device 5A disposed within the insulating glass material 20G. The insulating glass material 20G is spaced from the solar collector 125G creating an air space 130G.

A first wavelength of the electromagnetic radiation propagates through the glass substrate 20G to impinge upon the liquid conduit 120G and the solar collector 125G to heat the liquid within the liquid conduit 120G. A second wavelength of the electromagnetic radiation is absorbed by the photovoltaic device 5A for generating electrical power.

Typically, the first wavelength of the electromagnetic radiation absorbed by the liquid conduit 120G and the solar collector 125G is in the-wavelength range of 750 nm-$10^6$ nm. In the example, of the insulating substrate 20G formed from an insulating glass material 24G and a silicon carbide (SiC) photovoltaic energy conversion device 5G. The second wavelength of the electromagnetic radiation absorbed by the photovoltaic device 5A is in the wavelength range of $10^{-3}$ nm-$10^{12}$ nm.

Figure 23:
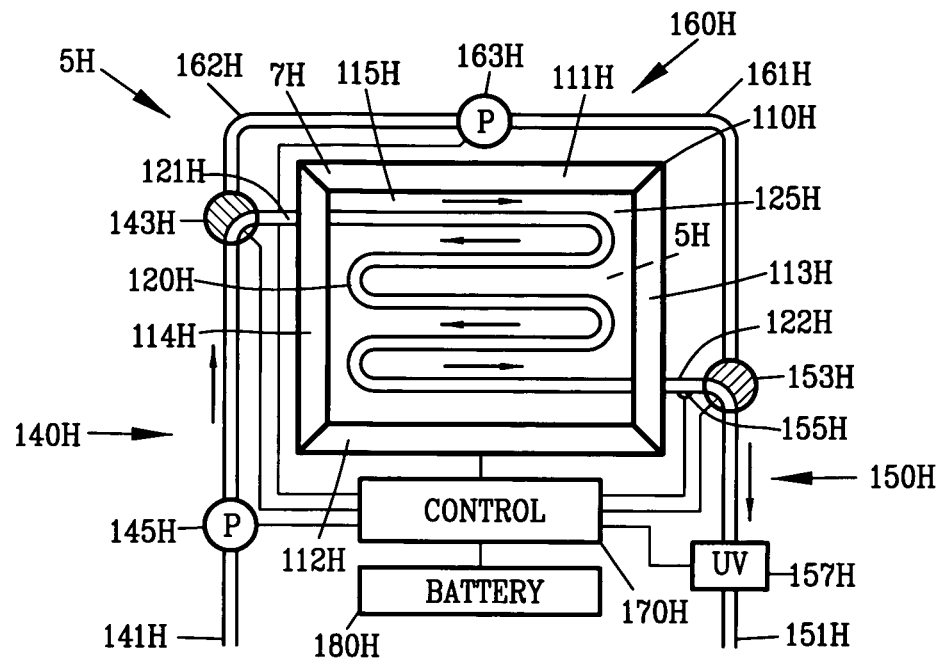
FIG. 23 illustrates an energy conversion device of the present invention in the form of a combined photovoltaic device and a solar heater for treating water.

FIG. 23 illustrates an energy conversion device 5H of the present invention in the form of a combined photovoltaic device 5A and a solar heater 7H for treating water. The energy conversion device 5H is similar to the energy conversion device 5G shown in FIGS. 20-22.

The energy conversion device 5H includes a frame support 110H comprising supports 111H-115H. The solar liquid heater 7H includes a liquid conduit 120H formed in a serpentine path extending between an input 121H and an output 122H. The liquid conduit 120H is in thermal contact with a solar collector 125H supported by the frame support 110H.

The energy conversion device 5H comprises an insulating substrate 20H formed from an insulating glass material 24H with the photovoltaic energy conversion device 5A disposed within the insulating glass material 20H. A first wavelength of the electromagnetic radiation propagates through the glass substrate 20H to impinge upon the liquid conduit 120H and the solar collector 125H to heat the water within the liquid conduit 120H. A second wavelength of the electromagnetic radiation is absorbed by the photovoltaic device 5A for generating electrical power.

The energy conversion device 5H comprises a water input 140H, a water output 150H and a water recirculator 160H. The energy conversion device 5H is controlled by a control 170H. The photovoltaic energy conversion device 5A charges a battery 180H for powering the control 170H. The water input 140H comprises an input conduit 141H connected to an input valve 143H in fluid communication with the input 121H of the liquid conduit 120H. An optional input pump 145H may be interposed in the input conduit 141H.

The water output 150H comprises an output conduit 151H connected to an input valve 153H in fluid communication with the output 122H of the liquid conduit 120H. A temperature sensor 155H is located for measuring the water exiting the output 122H of the liquid conduit 120H. An optional UV treatment stage 157H may be interposed in the output conduit 151H The water recirculator 160H comprises conduits 161H and 162H interconnecting the output valve 153H to the input valve 143H. A recirculating pump 163H is interposed between the conduits 161H and 162H.

Untreated water is directed into the input conduit 141H of the water input 140. Preferably, the untreated water is passed through a conventional filter prior to entering input conduit 141H. The optional pump 145H may be an electrically operated or a manually pump. In the alternative, the untreated water may flow by action of gravity into the input conduit 141H of the water input 140.

Untreated water is heated within the liquid conduit 120H for heat treating the untreated water. The temperature sensor 155H measures the temperature of the water exiting the output 122H of the liquid conduit 120H. If the temperature of the water is sufficient to properly treat the water, the treated water is discharged from the output conduit 151. An optional UV treatment stage 157H irradiates the treated water with ultraviolet radiation to further purify the water. The preferred UV radiation source is a wide bandgap material processed as disclosed herein and tuned to UV emission.

Figure 24:
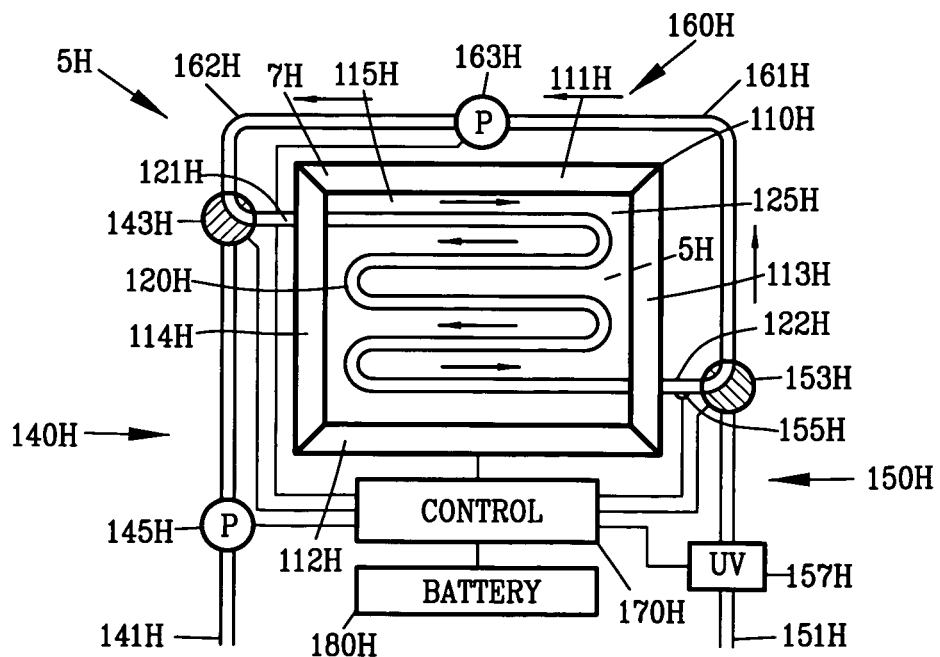
FIG. 24 illustrates the apparatus of FIG. 23 with the valves position to circulate the water.

FIG. 24 illustrates the apparatus of FIG. 23 with the valves position to circulate the water. In the event the temperature of the water exiting the output 122H of the liquid conduit 120H, the control 170 actuates the input valve 143, the output valve 153 and the recirculating pump 163 into the positions shown in FIG. 23. The water is recirculated through the liquid conduit 120H until the temperature of the water is sufficient to properly treat the water. Thereafter, the control 170 actuates the input valve 143, the output valve 153 and deactuates the recirculating pump 163 into the positions shown in FIG. 22 to discharge the treated water from the output conduit 151.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. The process for making a solid-state energy device, comprising the steps of:
    providing a substrate of an insulating material selected from the group consisting of silicon oxide ($SiO_2$) and alumina ($Al_2O_3$);
    converting a region of the insulating material of the substrate into a wide bandgap semi conductor material;
    forming a first conductor in the wide bandgap semiconductor material;
    converting a first portion of the wide bandgap semiconductor material into a first type wide bandgap semiconductor material in contact with the first conductor;
    converting a second portion of the wide bandgap semiconductor material into a second type wide bandgap semiconductor material in contact with the first wide bandgap semiconductor material; and
    forming a second conductor in contact with the second type wide bandgap semiconductor material.

2. The process for making a solid-state energy device from an insulating substrate, comprising the steps of:
    providing a glass substrate ($SiO_2$);
    converting a region of the glass substrate ($SiO_2$) into silicon carbide (SiC);
    forming a carbon rich silicon carbide (SiC) in the silicon carbide (SiC);
    converting a first portion of the silicon carbide (SiC) into a N-type silicon carbide material (SiC) in contact with the carbon rich silicon carbide (SiC);
    converting a second portion of the silicon carbide (SiC) into a P-type silicon carbide (SiC); and
    forming a carbon rich silicon carbide (SiC) in contact with the P-type silicon carbide (SiC).

3. The process for making a solid-state energy device from an insulating substrate, comprising the steps of:
    providing a ceramic substrate ($Al_2O_3$);
    converting a region of the ceramic substrate ($Al_2O_3$) into aluminum nitride (AlN);
    forming aluminum (Al) first conductor into aluminum nitride (AlN);

converting a first portion of the aluminum nitride (AlN) into N-type aluminum nitride (AlN);

converting a second portion of the aluminum nitride (AlN) into a P-type aluminum nitride (AlN); and forming an aluminum (Al) conductor in contact with the P-type aluminum nitride (AlN).

4. The process for making a solid-state energy device from an insulating glass substrate, comprising the steps of:

providing a substrate of an insulating glass material having a first surface and a second surface;

converting a portion of the insulating, glass material of the substrate into one of an N-type and a P-type silicon carbide wide bandgap semiconductor material;

converting an adjacent portion of the insulating glass material of the substrate into the other one of the N-type and the P-type silicon carbide wide bandgap semiconductor material and forming an electrical contact between the N-type and the P-type silicon carbide wide bandgap semiconductor materials;

providing a first conductor in electrical contact with one of the N-type and the P-type silicon carbide wide bandgap semiconductor materials; and providing a second conductor in electrical contact with the other of the N-type and the P-type silicon carbide wide bandgap semiconductor materials.

5. The process for making a solid-state energy device from a glass substrate, comprising the steps of:

providing a substrate of a glass material having a first surface and a second surface;

applying a wide bandgap forming doping gas selected from the group consisting of acetylene, ethylene and methane to the glass substrate;

concentrating a wide bandgap forming thermal energy inside of the substrate for converting a region of the glass material between the first and second surfaces into a silicon carbide material;

concentrating a first conductor forming thermal energy inside of the substrate to form a first conductor within the silicon carbide material between the first and second surfaces of the substrate;

applying a first type semiconductor forming doping gas selected from the group consisting of nitrogen ($N_2$) and diethyl selenium ($C_2H_5)_2Se$ to the substrate;

concentrating a first type semiconductor forming thermal energy inside of the substrate to form an N-type silicon carbide semiconductor material within the silicon carbide wide material between the first and second surfaces of the substrate and in electrical contact with the first conductor;

applying a second type semiconductor forming doping gas selected from the group consisting of trimethyl aluminum (($CH_3)_3Al$) and Bis(ethylbenzene)-chromium ($C_{16}H_{20}Cr$) to the substrate;

concentrating a second type semiconductor thermal energy inside of the substrate to form a P-type silicon carbide semiconductor material within the silicon carbide wide bandgap material between the first and second surfaces of the substrate and in electrical contact with the N-type silicon carbide semiconductor material; and concentrating a second conductor forming thermal energy on the substrate to form a second conductor in electrical contact with the P-type silicon carbide semiconductor material.

6. The process for making a solid-state energy device from aluminum oxide ceramic substrate, comprising the steps of:

providing a substrate of an aluminum oxide having a first surface and a second surface;

applying a carbon source to react with the oxide to form a carbon oxide for removing oxygen from the aluminum oxide;

applying a wide bandgap forming doping gas selected from the group consisting of nitrogen to the substrate;

concentrating a wide bandgap forming thermal energy inside of the substrate for converting a region of the aluminum oxide material between the first and second surfaces into an aluminum nitride material (AlN);

concentrating a first conductor forming thermal energy inside of the substrate to form a first conductor within the aluminum nitride material (AlN) between the first and second surfaces of the substrate;

applying a first type semiconductor forming doping gas selected from the group consisting of oxygen ($O_2$) and silane ($SiH_4$) to the substrate;

concentrating a first type semiconductor forming thermal energy inside of the substrate to form an N-type aluminum nitride semiconductor material within the aluminum nitride wide bandgap material between the first and second surfaces of the substrate and in electrical contact with the first conductor;

applying a second type semiconductor forming doping gas selected from the group consisting of methane ($CH_4$) and Bis-magnesium dihydrate [$Mg(TMHD)_2$] to the substrate;

concentrating a second type semiconductor thermal energy inside of the substrate to form a P-type aluminum nitride semiconductor material within the aluminum nitride bandgap material between the first and second surfaces of the substrate and in electrical contact with the N-type aluminum nitride semiconductor material semiconductor material; and concentrating a second conductor forming thermal energy on the substrate to form a second conductor in electrical contact with the P-type aluminum nitride semiconductor material.

* * * * *